(12) United States Patent
Matsueda et al.

(10) Patent No.: US 12,412,530 B2
(45) Date of Patent: Sep. 9, 2025

(54) DISPLAY DEVICE AND ELECTRONIC DEVICE

(71) Applicant: WUHAN TIANMA MICRO-ELECTRONICS CO., LTD., Wuhan (CN)

(72) Inventors: Yojiro Matsueda, Kanagawa (JP); Jiro Yanase, Kanagawa (JP)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 529 days.

(21) Appl. No.: 17/867,240

(22) Filed: Jul. 18, 2022

(65) Prior Publication Data

US 2023/0026192 A1 Jan. 26, 2023

(30) Foreign Application Priority Data

Jul. 21, 2021 (JP) ................. 2021-120823

(51) Int. Cl.
*G09G 3/3241* (2016.01)
*G09G 3/3233* (2016.01)
(Continued)

(52) U.S. Cl.
CPC ......... *G09G 3/3241* (2013.01); *G09G 3/3233* (2013.01); *H10K 50/86* (2023.02);
(Continued)

(58) Field of Classification Search
CPC ............ H10K 59/65; H10K 2102/311; H10K 59/1216; H10K 59/131; H10K 59/123; G09G 2320/0209; G09G 3/3233; G09G 2300/0426; G09G 2300/0852; G09G 2310/0297; G09G 2320/0233; G09G 2360/14; G09G 3/3241; G09G 2320/0204
See application file for complete search history.

(56) References Cited

U.S. PATENT DOCUMENTS 5,893,621 A * 4/1999 Sekiguchi ............. G02F 1/1365 349/49
2015/0144892 A1* 5/2015 Chang ................ H10K 59/1213 257/40
(Continued)

FOREIGN PATENT DOCUMENTS

CN 111477635 A * 7/2020 ......... G06K 9/00046

*Primary Examiner* — Chad M Dicke
*Assistant Examiner* — Jeremy Daniel Watts
(74) *Attorney, Agent, or Firm* — NIXON & VANDERHYE

(57) ABSTRACT

A second display region has a lower pixel density than a first display region. A third metal layer is located upper than a first metal layer and a second metal layer. The occupancy of the third metal layer in the second display region is lower than the occupancy in the first display region. In a pixel unit, the first metal layer includes a first electrode region to control an amount of electric current in a driving transistor, the second metal layer includes a second electrode region and a third electrode region to supply current to the driving transistor, and the third metal layer includes a main region to form a capacitor included in a capacitive element to store a control voltage for the driving transistor, and an island region surrounded by the main region with a gap and interconnected with a lower electrode region by a via region.

11 Claims, 18 Drawing Sheets

(51) Int. Cl.
  *H10K 50/86* (2023.01)
  *H10K 59/121* (2023.01)
  *H10K 59/131* (2023.01)
  *H10K 59/40* (2023.01)
  *H10K 59/65* (2023.01)
  *H10K 59/80* (2023.01)
  *H10K 77/10* (2023.01)
  *H10K 102/00* (2023.01)

(52) U.S. Cl.
  CPC ....... *H10K 59/1216* (2023.02); *H10K 59/131* (2023.02); *H10K 59/40* (2023.02); *H10K 59/65* (2023.02); *H10K 59/8791* (2023.02); *H10K 77/111* (2023.02); *G09G 2300/0426* (2013.01); *G09G 2300/0852* (2013.01); *G09G 2310/0297* (2013.01); *G09G 2320/0233* (2013.01); *G09G 2330/021* (2013.01); *G09G 2330/04* (2013.01); *G09G 2360/14* (2013.01); *H10K 2102/311* (2023.02)

(56) References Cited

U.S. PATENT DOCUMENTS

| | | |
|---|---|---|
| 2019/0393294 A1 | 12/2019 | Song et al. |
| 2020/0133083 A1* | 4/2020 | Chun ................ G02F 1/136227 |
| 2020/0312941 A1 | 10/2020 | Na et al. |
| 2021/0376044 A1* | 12/2021 | Kim ...................... H10K 59/805 |
| 2021/0408170 A1* | 12/2021 | Li ......................... H10K 59/65 |
| 2022/0019757 A1* | 1/2022 | Han .................... G09G 3/3266 |

* cited by examiner

DISPLAY DEVICE AND ELECTRONIC DEVICE

CROSS-REFERENCE TO RELATED APPLICATIONS

This non-provisional application claims priority under 35 U.S.C. § 119(a) on Patent Application No. 2021-120823 filed in Japan on Jul. 21, 2021, the entire content of which is hereby incorporated by reference.

BACKGROUND

This disclosure relates to a display device.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of flat panel display devices.

The display region of an OLED display device can include a region having a pixel density different from the pixel density of the other region. For example, some portable terminals, such as smartphones and tablet computers, include a photosensitive element like a camera for taking a picture under the display region. For the camera to receive external light, the camera is disposed under a region having a lower pixel density than the surroundings.

SUMMARY

An aspect of this disclosure is a display device including: a first display region configured to display an image; a second display region configured to display an image, the second display region having a lower pixel density than the first display region; a first metal layer; a second metal layer located upper than the first metal layer; and a third metal layer located upper than the first metal layer and the second metal layer. Occupancy of the third metal layer in the second display region is lower than occupancy of the third metal layer in the first display region. The first display region includes a plurality of first pixel units and each of the plurality of first pixel units includes: a light-emitting element including an upper electrode region, a lower electrode region, and a light-emitting layer located between the upper electrode region and the lower electrode region; and a driving transistor configured to control light emission of the light-emitting element. The first metal layer, the second metal layer, and the third metal layer are located lower than the lower electrode region. In each of the plurality of first pixel units, the first metal layer includes a first electrode region configured to control an amount of electric current in a channel of the driving transistor. In each of the plurality of first pixel units, the second metal layer includes a second electrode region and a third electrode region configured to supply electric current to the channel of the driving transistor. In each of the plurality of first pixel units, the third metal layer includes: a main region configured to be supplied with a power supply potential and form a capacitor included in a first capacitive element with the second metal layer, the first capacitive element being configured to store a voltage to control the driving transistor; and an island region separated from the main region and surrounded by the main region with a gap, the island region being interconnected with the lower electrode region by a via region.

An aspect of this disclosure is a display device including: a first display region configured to display an image; a second display region configured to display an image, the second display region having a lower pixel density than the first display region; a first metal layer; a second metal layer located upper than the first metal layer; and a third metal layer located upper than the first metal layer and the second metal layer. A pattern of the third metal layer in the second display region is different from a pattern of the third metal layer in the first display region. The first display region includes a plurality of first pixel units and each of the plurality of first pixel units includes: a light-emitting element including an upper electrode region, a lower electrode region, and a light-emitting layer located between the upper electrode region and the lower electrode region; and a driving transistor configured to control light emission of the light-emitting element. The first metal layer, the second metal layer, and the third metal layer are located lower than the lower electrode region. In each of the plurality of first pixel units, the first metal layer includes a first electrode region configured to control an amount of electric current in a channel of the driving transistor. In each of the plurality of first pixel units, the second metal layer includes a second electrode region and a third electrode region configured to supply electric current to the channel of the driving transistor. In each of the plurality of first pixel units, the third metal layer includes: a main region configured to be supplied with a power supply potential and form a capacitor included in a first capacitive element with the second metal layer, the first capacitive element being configured to store a voltage to control the driving transistor; and an island region separated from the main region and surrounded by the main region with a gap, the island region being interconnected with the lower electrode region by a via region.

It is to be understood that both the foregoing general description and the following detailed description are exemplary and explanatory and are not restrictive of this disclosure.

EMBODIMENTS

Figure 1:
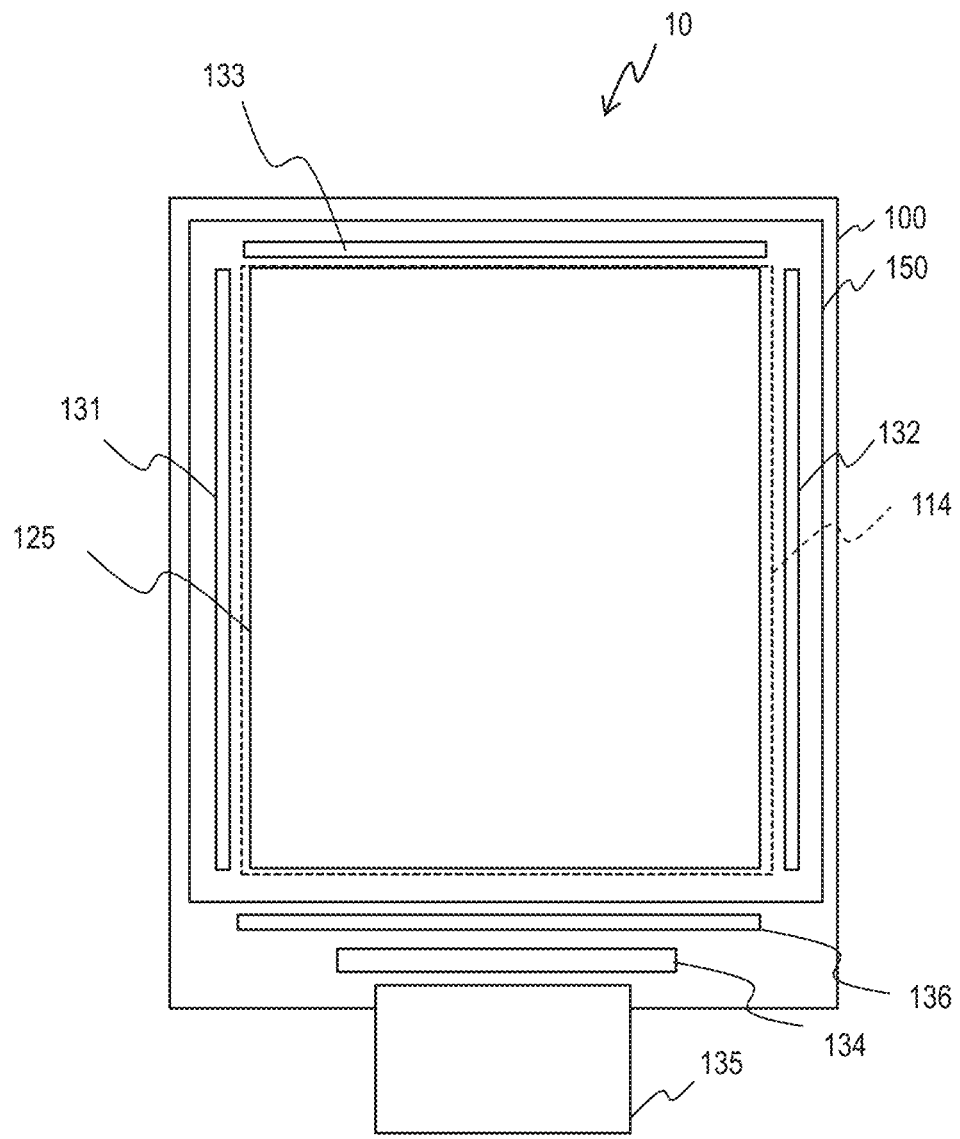
FIG. 1 schematically illustrates a configuration example of an OLED display device.

Hereinafter, embodiments of this disclosure will be described with reference to the accompanying drawings. It should be noted that the embodiments are merely examples to implement this disclosure and not to limit the technical scope of this disclosure.

In the following description, a pixel is the smallest unit in the display region and an element for emitting light of a single color. It is also referred to as subpixel. A set of pixels of different colors (red, blue, and green, for example) constitute an element for displaying one mixed-color dot. This element can be referred to as main pixel. When the element for emitting light of a single color needs to be distinguished from the element for emitting light of a mixed color for clarity of description, the former is referred to as subpixel and the latter as main pixel. The features of this description are applicable to monochrome display devices whose display region is composed of monochrome pixels.

A configuration example of a display device is described. The display region of the display device includes a region (also referred to as low-density region or low-resolution region) having a relatively low pixel density and a region (also referred to as normal region or normal-resolution region) having a relatively high pixel density. The display region can include a plurality of low-density regions where the pixel density is lower than the normal region and these low-density regions can have different pixel densities. The light-emitting element of a pixel in the examples described in the following is a current-driven element, such as organic light-emitting diode (OLED) element.

Raising the density of pixel circuits to attain higher resolution may cause some problems as follows. One of them is that the power lines are thinned (narrowed) and have higher resistance, which causes non-uniformity of the anode power supply voltage (IR drop) within the plane. Another one is that the storage capacitor gets closer to lines and a crosstalk occurs because of capacitive coupling, so that the storage capacitor cannot retain an accurate potential (meaning that desired light cannot be obtained from a light-emitting element). Still another one is that, in the case where the display device is a flexible display device, thin metal lines provided on an insulating layer or a polysilicon layer are easily broken when the substrate is bent.

A pixel unit of a display device in an embodiment of this specification includes a first metal layer including gate electrode regions, a second metal layer including source/drain electrode regions, and moreover, a third metal layer located upper than these layers. A gate electrode region is a first electrode region for controlling the amount of electric current in the channel of a transistor. A source/drain electrode region is a second electrode region or a third electrode region for supplying the electric current to the channel of the transistor.

The third metal layer is supplied with a power supply potential for the light-emitting element and forms a storage capacitor for the driving field-effect transistor with the second metal layer. The display region includes a normal region and a low-density region, between which the third metal layer has different patterns. This configuration reduces the IR drop of the power supply potential and further, provides characteristics suitable for each display region to the pixel units therein.

Configuration of Display Device

An overall configuration of the display device in an embodiment of this specification is described with reference to FIG. 1. The elements in the drawings may be exaggerated in size or shape for clear understanding of the description. In the following, an organic light-emitting diode (OLED) display device is described as an example of the display device.

FIG. 1 schematically illustrates a configuration example of an OLED display device 10. The OLED display device 10 includes a thin-film transistor (TFT) substrate 100 on which OLED elements (light-emitting elements) are fabricated and a structural encapsulation unit 150 for encapsulating the OLED elements. In the periphery of a cathode electrode region 114 outer than the display region 125 of the TFT substrate 100, control circuits, specifically a scanning driver 131, an emission driver 132, an electrostatic discharge protection circuit 133, a driver IC 134, and a demultiplexer 136, are provided.

The driver IC 134 is connected to the external devices via flexible printed circuits (FPC) 135. The scanning driver 131 drives scanning lines on the TFT substrate 100. The emission driver 132 drives emission control lines to control light emission of pixels. The electrostatic discharge protection circuit 133 saves the elements on the TFT substrate 100 from electrostatic discharge damage. The driver IC 134 is mounted with an anisotropic conductive film (ACF), for example.

The driver IC 134 provides power and control signals including a timing signal to the scanning driver 131 and the emission driver 132 and further, provides power and a data signal to the demultiplexer 136. The demultiplexer 136 outputs output of one pin of the driver IC 134 to d data lines (d is an integer greater than 1) in series. The demultiplexer 136 changes the output data line for the data signal from the driver IC 134 d times per scanning period to drive d times as many data lines as output pins of the driver IC 134.

Pixel Circuit

Figure 2:
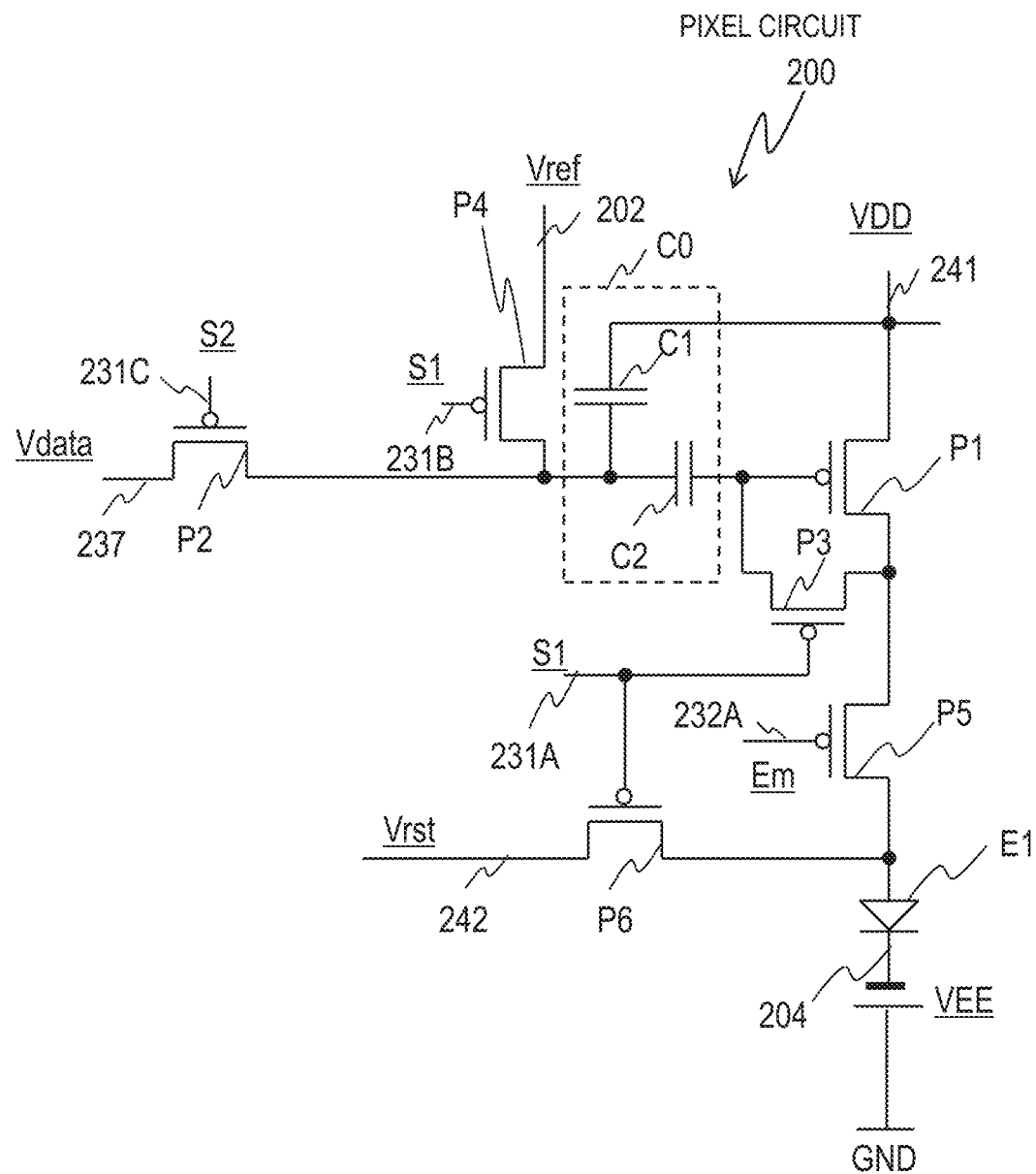
FIG. 2 illustrates a configuration example of a pixel circuit and control signals therefor in an embodiment of this specification.

FIG. 2 illustrates a configuration example of a pixel circuit 200 and control signals therefor in an embodiment of this specification. The pixel circuit 200 is included in an N-th pixel circuit row (N is an integer). The pixel circuit 200 includes six transistors (TFTs) P1 to P6 each having a gate, a source, and a drain. All transistors P1 to P6 in this example are p-type TFTs.

The transistor P1 is a driving transistor for controlling the amount of electric current to an OLED element E1. The source of the driving transistor P1 is connected with a power line 241 for transmitting a power supply potential VDD. The driving transistor P1 controls the amount of electric current to be supplied from the power line 241 to the OLED element E1 in accordance with a voltage stored in a storage capacitive element C0. The storage capacitive element C0 holds the written voltage throughout one frame period. The cathode of the OLED element E1 is connected with a power line 204 for transmitting a power supply potential VEE from a cathode power supply.

The storage capacitive element C0 in the configuration example of FIG. 2 consists of a first capacitive element C1 and a second capacitive element C2 connected in series. One end of the storage capacitive element C0 is supplied with the anode power supply potential VDD and the other end is connected with the gate of the driving transistor P1.

The storage capacitive element C0 consists of the capacitive elements C1 and C2 connected in series in between the power line 241 for transmitting the anode power supply potential VDD and the gate of the driving transistor P1. An end of the capacitive element C1 is connected with the power line 241 and the other end of the capacitive element C1 is connected with an end of the capacitive element C2. The other end of the capacitive element C2 is connected with the gate of the driving transistor P1. The source/drain of the transistor P4 and the source/drain of the transistor P2 are connected with an intermediate node between the capacitive elements C1 and C2.

The voltage of the storage capacitive element C0 is a voltage between the gate of the driving transistor P1 and the VDD power line 241. The source of the driving transistor P1 is connected with the VDD power line 241; the source potential is the anode power supply potential VDD. Accordingly, the storage capacitive element C0 stores the gate-source voltage of the driving transistor P1.

The transistor P5 is an emission control switching transistor for controlling ON/OFF of supply of driving current to the OLED element E1 and the resulting light emission of the OLED element E1. The source of the transistor P5 is connected with the drain of the driving transistor P1. The transistor P5 switches ON/OFF the current supply to the OLED element E1 connected with its drain. The gate of the transistor P5 is connected with a control signal line 232A and the transistor P5 is controlled by the emission control signal Em input from the emission driver 132. The emission control signal is a selection signal for controlling light emission of the OLED element E1.

The transistor P6 works to supply a reset potential Vrst to the anode of the OLED element E1. One end of the source/drain of the transistor P6 is connected with a power line 242 for transmitting the reset potential Vrst and the other end is connected with the anode of the OLED element E1.

The gate of the transistor P6 is connected with a control signal line 231A and the transistor P6 is controlled by a selection signal S1. When the transistor P6 is turned ON by the selection signal S1 from the scanning driver 131, the transistor P6 supplies the reset potential Vrst transmitted by the power line 242 to the anode of the OLED element E1. The transistors P5 and P6 also supply the reset potential Vrst to the gate of the driving transistor P1 via the transistor P3.

The transistor P3 is a switching transistor (threshold compensation transistor) for writing a voltage for applying threshold calibration (threshold compensation) to the driving transistor P1 to the storage capacitive element C0 and is also a transistor for resetting the gate potential of the driving transistor P1. The source and the drain of the transistor P3 connect the gate and the drain of the driving transistor P1. Accordingly, when the transistor P3 is ON, the driving transistor P1 is diode connected.

The transistor P4 is a switching transistor (threshold compensation transistor) for writing a voltage for applying threshold compensation to the driving transistor P1 to the storage capacitive element C0. The transistor P4 controls whether to supply a reference potential Vref to the storage capacitive element C0. One end of the source/drain of the transistor P4 is connected with a power line 202 for transmitting the reference potential Vref and the other end is connected with an intermediate node between the capacitive elements C1 and C2. The gate of the transistor P4 is connected with a control signal line 231B and the transistor P4 is controlled by the selection signal S1 input from the scanning driver 131 to its gate.

The transistors P3, P6, and P4 are controlled by the selection signal S1. Accordingly, these transistors P3, P6, and P4 are turned ON/OFF simultaneously. During the period where these transistors are ON, the transistor P5 is turned ON to reset the gate potential of the driving transistor P1 and then turned OFF. When the transistors P3 and P4 are ON, the transistor P1 is a diode-connected transistor. A threshold compensation voltage based on the power supply potential VDD and the reference potential Vref is written to the storage capacitive element C0.

The transistor P2 is a switching transistor for selecting a pixel circuit to be supplied with a data signal and writing the data signal (data signal voltage) Vdata to the storage capacitive element C0. One end of the source/drain of the transistor P2 is connected with the storage capacitive element C0 and the other end is connected with a data line 237 for transmitting the data signal Vdata.

The gate of the transistor P2 is connected with a control signal line 231C for transmitting a selection signal S2 from the scanning driver 131. The transistor P2 is controlled by the selection signal S2. The selection signal S2 is a signal different from the selection signal S1. For the pixel circuit 200, the selection signal S2 is a selection signal for controlling supply of the data signal Vdata to the storage capacitive element C0. When the transistor P2 is ON, the transistor P2 supplies the data signal Vdata supplied from the driver IC 134 through the data line 237 to the storage capacitive element C0.

Structure of Pixel Unit

Figure 3:
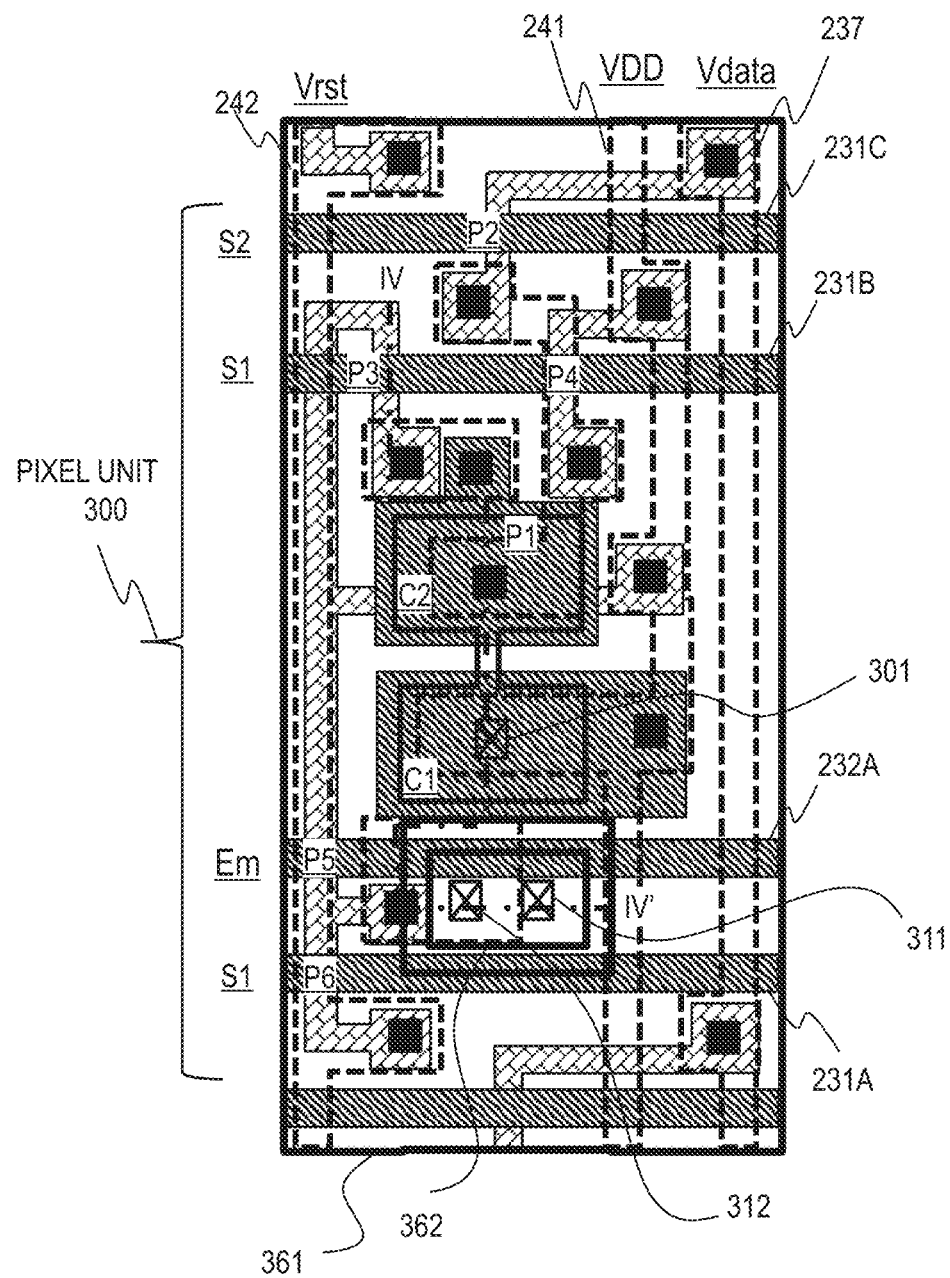
FIG. 3 is a plan diagram schematically illustrating a device structure of one pixel unit.

Hereinafter, a structure of a pixel unit in the display region 125 is described. FIG. 3 is a plan diagram schematically illustrating a device structure of one pixel unit 300. FIG. 3 schematically illustrates one entire pixel unit 300 and parts of neighboring pixel units. The pixel unit 300 is also referred to as pixel region. The pixel unit 300 has the circuit configuration described with reference to FIG. 2. Specifically, the pixel unit 300 includes six thin-film transistors P1 to P6 and two capacitive elements C1 and C2 as illustrated in FIG. 3. The light-emitting element E1 is excluded from FIG. 3 for simplicity of illustration.

FIG. 3 further includes a VDD power line 241 for transmitting the power supply potential VDD and a power line 242 for transmitting the reset potential Vrst. The reference potential Vref can be the same as the anode power supply potential VDD. Moreover, FIG. 3 includes a control signal lines 231A and 231B for transmitting the selection signal S1, a control signal line 231C for transmitting the selection signal S2, and a control signal line 232A for transmitting the emission control signal Em. FIG. 3 also includes a data line 237 for transmitting the data signal Vdata.

In FIG. 3, the metal layer (second metal layer to be described later) including the power line 241 is outlined by dashed lines. The parts of one same layer are denoted by the identical patterns. One layer is made of the same material by the same process. Each layer can be a single component layer made of a single material or can have a multi-layered structure consisting of a plurality of component layers made of different materials. In FIG. 3, via regions (also referred to as contact regions), which are conductive regions provided in holes opened perpendicularly through an insulator to interconnect different layers, are denoted by filled squares or squares with an X inside.

The squares with an X inside represent via regions between a third metal layer to be described later and another conductive layer and the filled squares represent via regions between the second metal layer and another conductive layer. For example, the via region 301 interconnects the third metal layer and the VDD power line 241 and the via region 311 interconnects the third metal layer and the anode electrode of the OLED element E1.

The third metal layer includes a main region 361 occupying a large area of the pixel unit 300 and an island region 362 provided inside an opening of the main region 361. The main region 361 fills all area surrounding the opening and occupies more than a half of the area of the pixel unit 300. The island region 362 is completely surrounded by a gap and physically and electrically isolated from the main region 361.

Figure 4:
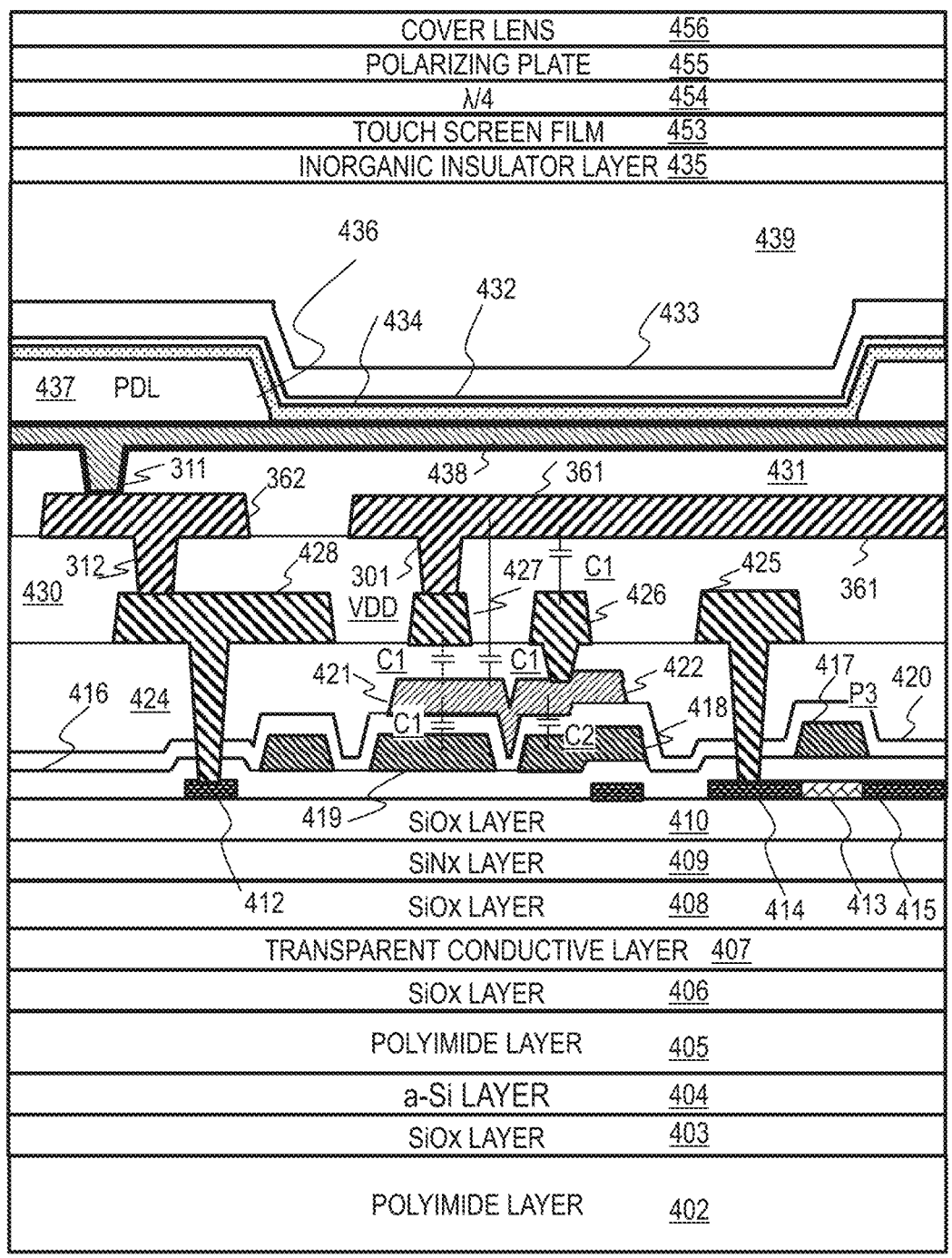
FIG. 4 schematically illustrates the cross-sectional structure along the section line IV-IV' in FIG. 3.

FIG. 4 schematically illustrates the cross-sectional structure along the section line IV-IV' in FIG. 3. FIG. 4 schematically illustrates the cross-sectional structure of a configuration of a pixel unit 300 including a flexible substrate, a driving TFT, and an OLED element of a TFT substrate 100 and a structural encapsulation unit 150. In the following description, the definitions of upper side and lower side correspond to the upper side and the lower side of the drawing.

The TFT substrate 100 includes a flexible substrate and pixel circuits (a TFT array) and OLED elements fabricated on the flexible substrate. The flexible substrate includes a polyimide layer 402, a silicon oxide layer (SiOx layer) 403, an amorphous silicon layer (a-Si layer) 404, and a polyimide layer 405 in this order from the bottom. The silicon oxide layer 403 is formed above and in direct contact with the polyimide layer 402. The amorphous silicon layer 404 is formed above and in direct contact with the silicon oxide layer 403. The polyimide layer 405 is formed above and in direct contact with the amorphous silicon layer 404.

The TFT substrate 100 further includes a silicon oxide layer 406, a transparent conductive layer 407, a silicon oxide layer 408, a silicon nitride layer (SiNx layer) 409, and a silicon oxide layer 410 in this order from the bottom above the flexible substrate (polyimide layer 405). The transparent conductive layer 407 can be made of an amorphous oxide (such as ITO or IZO) or amorphous silicon (a-Si). The pixel circuits (TFT array) and OLED elements are fabricated above the silicon oxide layer 410.

The silicon oxide layer 406 is formed between and in direct contact with the polyimide layer 405 and the transparent conductive layer 407. The silicon oxide layer 406 fully covers the polyimide layer 405. The silicon oxide layer 408 is formed above and in direct contact with the transparent conductive layer 407. The silicon nitride layer 409 is formed above and in direct contact with the silicon oxide layer 408. The silicon oxide layer 410 is formed above and in direct contact with the silicon nitride layer 409.

OLED elements are fabricated above the flexible substrate including the above-described multiple layers. Each OLED element includes a lower electrode region (for example, an anode electrode 438), an upper electrode region (for example, a cathode electrode 432), and a multilayer organic light-emitting film 434 located between the cathode electrode 432 and the anode electrode 438. A plurality of anode electrodes 438 are disposed on the same plane (for example, on a planarization film 431) and one multilayer organic light-emitting film 434 is disposed above one anode electrode 438. In the example of FIG. 4, the cathode electrode 432 of one pixel is a part of an unseparated conductive film covering the whole display region 125.

Illustrated in FIG. 4 is an example of a top-emission pixel structure, which includes top-emission type of OLED elements. The top-emission pixel structure is configured in such a manner that a cathode electrode 432 common to a plurality of pixels is provided on the light emission side (the upper side of the drawing). The cathode electrode 432 has a shape that fully covers the display region 125. The top-emission pixel structure is characterized by that the anode electrode 438 has light reflectivity and the cathode electrode 432 has light transmissivity. Hence, a configuration to transmit light coming from the multilayer organic light-emitting film 434 toward the structural encapsulation unit 150 is attained. The cathode electrode 432 can be a semi-transparent film disposed at an optically optimum distance from the anode electrodes 438 to form a resonant structure.

The bottom-emission pixel structure has a transparent anode electrode and a reflective cathode electrode to emit light to the external through a flexible substrate. If both the anode electrode and the cathode electrode are made of light transmissive materials, a transparent display device can be obtained. The structure of the flexible substrate of this disclosure is applicable to OLED display devices of any of these types and further, display devices including light-emitting elements different from OLEDs.

A subpixel of a full-color OLED display device usually lights in one of the colors of red, green, and blue. A red subpixel, a green subpixel, and a blue subpixel constitute one main pixel. A pixel circuit including a plurality of thin-film transistors controls light emission of an OLED element associated therewith. An OLED element is composed of an anode electrode of a lower electrode region, an organic light-emitting film, and a cathode electrode of an upper electrode region.

Each pixel unit 300 includes a pixel circuit including a plurality of switching transistors and a driving transistor. The pixel circuit is fabricated between the silicon oxide layer 410 and an anode electrode 438 and controls the electric current to be supplied to the anode electrode 438. The transistor P3 illustrated in FIG. 4 has a top-gate structure. The other transistors also have a top-gate structure.

A polysilicon layer is provided above and in direct contact with the silicon oxide layer 410. The polysilicon layer includes a channel 413 that determines the transistor characteristics of the transistor P3 at the location where a gate electrode region 417 is to be formed later. At both ends of the channel 413, source/drain regions 414 and 415 are provided. The source/drain regions 414 and 415 are doped with high-concentration impurities to be electrically connected with a wiring layer thereabove. FIG. 4 further includes a source/drain region 412 of a transistor P5.

Lightly doped drains (LDDs) doped with low-concentration impurities can be provided between the channel 413 and the source/drain region 414 and between the channel 413 and the source/drain region 415. FIG. 4 omits the LDDs to avoid complexity. The polysilicon layer further includes regions to be used as parts of lines and electrodes.

Above the polysilicon layer, a first metal layer including the gate electrode region 417 and electrode regions 418 and 419 is provided with a gate insulating layer 416 interposed therebetween. The electrode region 418 includes a gate electrode region of a not-shown driving transistor P1. The first metal layer can be made of a metal having a high melting point, such as W, Mo, or Ta, or an alloy of such a metal.

An interlayer insulating film 420 is provided to cover the first metal layer. The interlayer insulating film 420 can be made of silicon oxide or silicon nitride. An intermediate conductive layer including electrode regions 421 and 422 is provided above and in direct contact with the interlayer insulating film 420. The intermediate conductive layer can be made of a low-resistive semiconductor, a metal having a high melting point such as W, Mo, or Ta, or an alloy of such a metal. The intermediate conductive layer increases the capacitance of the storage capacitive element C0 with a smaller area.

In the example of FIG. 4, the electrode region 421 overlaps the electrode region 419 of the first metal layer in the layering direction with the interlayer insulating film 420 interposed therebetween. The electrode region 422 overlaps the electrode region 418 of the first metal layer in the layering direction with the interlayer insulating film 420 interposed therebetween. A part of the first capacitive element C1 is formed between the electrode regions 421 and 419. The electrode region 419 is supplied with the anode power supply potential VDD. A part of the second capacitive element C2 is formed between the electrode regions 422 and 418.

A planarization film 424 is provided to cover the intermediate conductive layer and the interlayer insulating film 420. The planarization film 424 can be made of an organic or inorganic insulator and it is in direct contact with the intermediate conductive layer and the interlayer insulating film 420.

A second metal layer including a source/drain electrode region 425 is provided above the planarization film 424. The second metal layer can have a single layer structure of aluminum or a multilayered structure of Ti/Al/Ti. The source/drain electrode region 425 is connected with the source/drain region 414 of the polysilicon layer by a via region provided in a hole opened in the layering direction through the interlayer insulating film 420 and the gate insulating layer 416.

The second metal layer further includes an electrode region 426. The electrode region 426 is connected with the electrode region 422 of the intermediate conductive layer by a via region provided in a hole opened in the layering direction through the planarization film 424. These electrode regions are at the same potential.

The second metal layer still further includes an electrode region 427. The electrode region 427 is opposed to the electrode region 421 of the intermediate conductive layer in the layering direction and the interlayer insulating film 420 is interposed therebetween. A part of the first capacitive element C1 is formed between the electrode regions 427 and 421.

The second metal layer still further includes an electrode region 428. The electrode region 428 is connected with the source/drain region 412 of the transistor P5 by a via region provided in a hole opened straight downward through the planarization film 424, the interlayer insulating film 420, and the gate insulating layer 416.

Another planarization film 430 is provided to cover the second metal layer and the planarization film 424. The planarization film 430 can be made of an organic or inorganic insulator and it is in direct contact with the second metal layer and the planarization film 424.

A third metal layer including the main region 361 and the island region 362 is provided above the planarization film 430. The third metal layer can have a single layer structure of aluminum or a multilayered structure of Ti/Al/Ti; it is in direct contact with the planarization film 430. As described above, the island region 362 is isolated from the main region 361 and surrounded by the main region 361 with a gap. The main region 361 surrounds the island region 362 and there is a gap around the island region 362.

The main region 361 is connected with the electrode region 427 of the second metal layer by a via region 301 extending straight downward in a hole of the planarization film 430. The main region 361 is supplied with the anode power supply potential VDD through the electrode region 427.

The main region 361 in this example covers the entire intermediate conductive layer when viewed in the layering direction (in the vertical direction in FIG. 4). The main region 361 is partially opposed to parts of the electrode regions 421 and 422 of the intermediate conductive layer across the planarization films 430 and 424. The main region 361 forms a part of the first capacitive element C1 with the electrode regions 421 and 422. Furthermore, the main region 361 is partially opposed to the electrode region 426 of the second metal layer across the planarization film 430. The main region 361 forms another part of the first capacitive element C1 with the electrode region 426.

As described above, the first capacitive element C1 in this example includes a capacitor between the electrode region 421 of the intermediate conductive layer and the electrode region 419 of the first metal layer, a capacitor between the electrode region 421 and the electrode region 427 of the second metal layer, a capacitor between the electrode regions 421 and 422 of the intermediate conductive layer and the main region 361 of the third metal layer, and a capacitor between the electrode region 426 of the second metal layer and the main region 361 of the third metal layer.

The electrode region 427 of the second metal layer and the main region 361 of the third metal layer are at the same potential. The electrode region 426 of the second metal layer and the electrode regions 421 and 422 of the intermediate conductive layer are at the same potential. The electrode regions 419 and 427 and the main region 361 are supplied with the anode power supply potential VDD. As understood from this description, the first capacitive element C1 includes a capacitor between the intermediate conductive layer and the third metal layer, in addition to a capacitor between the intermediate conductive layer and the first metal layer.

The second capacitive element C2 consists of a capacitor between the electrode region 422 of the intermediate conductive layer and the electrode region 418 of the first metal layer. The electrode region 418 extends to the gate electrode of the driving transistor P1. As understood from this description, the second capacitive element C2 consists of only the capacitor between the intermediate conductive layer and the first metal layer.

As described above, the intermediate conductive layer forms a capacitor included in the second capacitive element C2 with the first metal layer and forms capacitors included in the first capacitive element C1 with the main region 361, the second metal layer, and the first metal layer.

The main region 361 of the third metal layer occupies a large area of the pixel unit 300 and covers the whole intermediate conductive layer including the electrode regions 421 and 422 of the storage capacitive element C0. Since the main region 361 is supplied with a constant anode power supply potential VDD, the voltage variation in the storage capacitive element C0 caused by crosstalk can be reduced. Furthermore, the power line attains a larger area with the main region 361, which reduces the possibility of breakage of the power line caused by bend and the IR drop.

The island region 362 is connected with the electrode region 428 of the second metal layer by a via region 312 under the island region 362. The via region 312 extends in the layering direction through the planarization film 430 and is in direct contact with the electrode region 428.

A planarization film 431 is provided to cover the third metal layer and the planarization film 430. The planarization film 431 can be made of an organic or inorganic insulator and is in direct contact with the third metal layer and the planarization film 430.

An anode electrode 438 is provided above the planarization film 431. The anode electrode 438 is in direct contact with the planarization film 431. The anode electrode 438 is connected with the source/drain region 412 through a contact hole of the planarization film 431. The TFTs of the pixel circuit are fabricated under the anode electrode 438. The anode electrode 438 consists of a reflective metal layer in the middle and transparent conductive layers sandwiching the reflective metal layer, for example. The anode electrode 438 can have a structure of ITO/Ag/ITO or IZO/Ag/IZO.

The anode electrode 438 is connected with the island region 362 of the third metal layer by a via region under the anode electrode 438. The via region extends in the layering direction through the planarization film 431 and is in direct contact with the island region 362. The source/drain region 412, the electrode region 428 of the second metal layer, and the island region 362 supply a driving potential (anode potential) that determines the brightness (the amount of light) of the light-emitting element. The island region 362 is distant from and outside the main region 361 to be supplied with the power supply potential VDD. For this reason, the island region 362 can supply the driving potential to the anode electrode 438.

An insulating pixel defining layer (PDL) 437 is provided above the anode electrode 438 to separate OLED elements. Each OLED element is fabricated in an opening 436 of the pixel defining layer 437.

Above the anode electrode 438, a multilayer organic light-emitting film 434 is provided. The multilayer organic light-emitting film 434 is in contact with the pixel defining layer 437 in an opening 436 of the pixel defining layer 437 and its periphery. The multilayer organic light-emitting film 434 is formed by depositing organic light-emitting material for the color of R, G, or B on the anode electrode 438.

The multilayer organic light-emitting film 434 is formed by vapor deposition of organic light-emitting material in the region corresponding to a pixel through a metal mask. The multilayer organic light-emitting film 434 consists of, for example, a hole injection layer, a hole transport layer, a light-emitting layer, an electron transport layer, and an electron injection layer in this order from the bottom. The layered structure of the multilayer organic light-emitting film 434 is determined depending on the design.

A cathode electrode 432 is provided over the multilayer organic light-emitting film 434. The cathode electrode 432 is a light-transmissive electrode. The cathode electrode 432 transmits part of the visible light coming from the multilayer organic light-emitting film 434. The layer of the cathode electrode 432 is formed by vapor deposition of a metal such as Ag or Mg or an alloy thereof. If the resistance of the cathode electrode 432 is so high to impair the uniformity of the brightness of emitted light, an additional auxiliary electrode layer is provided using a material for a transparent electrode, such as ITO, IZO, ZnO, or $In_2O_3$.

The stack of an anode electrode 438, a multilayer organic light-emitting film 434, and a cathode electrode 432 formed in an opening 436 of the pixel defining layer 437 corresponds to an OLED element. A structural encapsulation unit 150 is provided above and in direct contact with the cathode electrode 432. The structural encapsulation unit (thin-film encapsulation unit) 150 includes an inorganic insulator (for example, SiNx or AlOx) layer 433, an organic planarization film 439, and another inorganic insulator (for example, SiNx or AlOx) layer 435.

A touch screen film 453, a λ/4 plate 454, a polarizing plate 455, and a resin cover lens 456 are laid in this order from the bottom, on the encapsulation structural unit 150. The λ/4 plate 454 and the polarizing plate 455 are to reduce the reflection of the light coming from the external. The layered structure of the OLED display device described with reference to FIG. 4 is an example; one or more of the layers in FIG. 4 may be omitted and one or more layers not shown in FIG. 4 may be added. For example, the intermediate conductive layer can be excluded. If the intermediate conductive layer is excluded, a storage capacitor is formed between the polysilicon layer doped with high-concentration impurities and the gate electrode with the gate insulating layer 416 interposed therebetween.

FIGS. 5A to 5G illustrate patterns of some layers included in the layered structure of the TFT substrate 100. FIGS. 5A to 5G are sorted to illustrate the layers in order of formation on the flexible substrate (from the bottom).

Figure 5A:
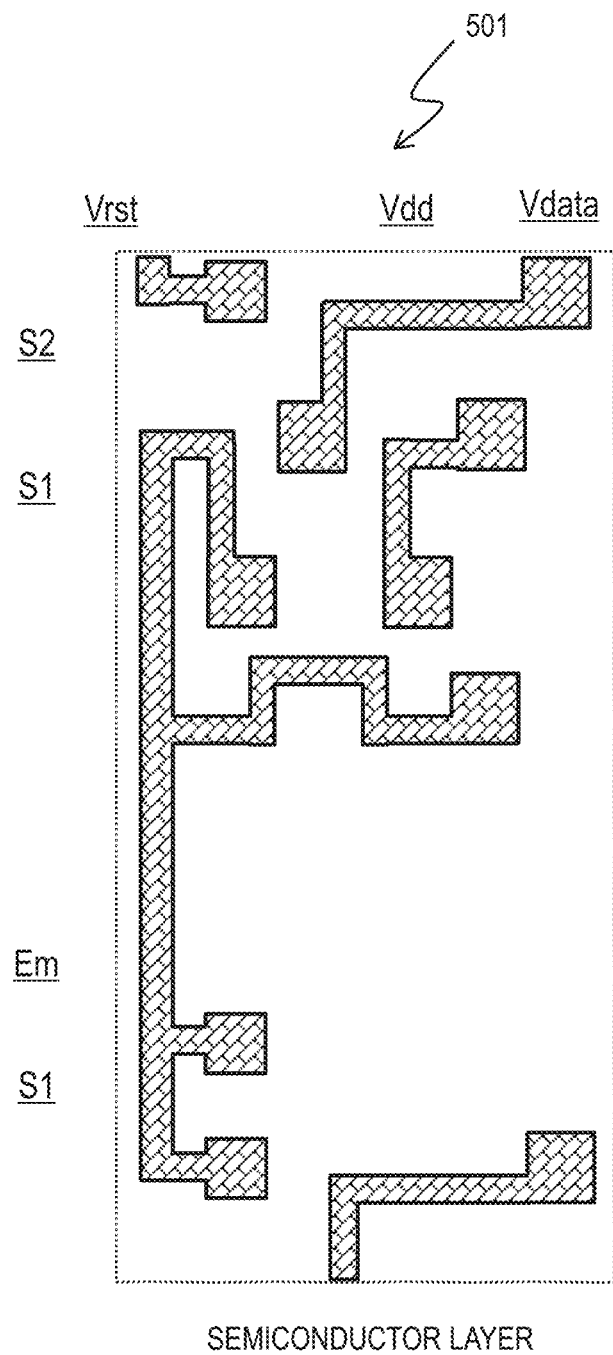
FIG. 5A illustrates a pattern of a layer included in the layered structure of a TFT substrate.

FIG. 5A schematically illustrates a semiconductor (such as polysilicon) layer pattern 501. The semiconductor layer pattern 501 includes channel regions having high resistance. Some parts of the semiconductor layer pattern 501 are doped with impurities to become low-resistive regions having lower resistance than the channel regions.

Figure 5B:
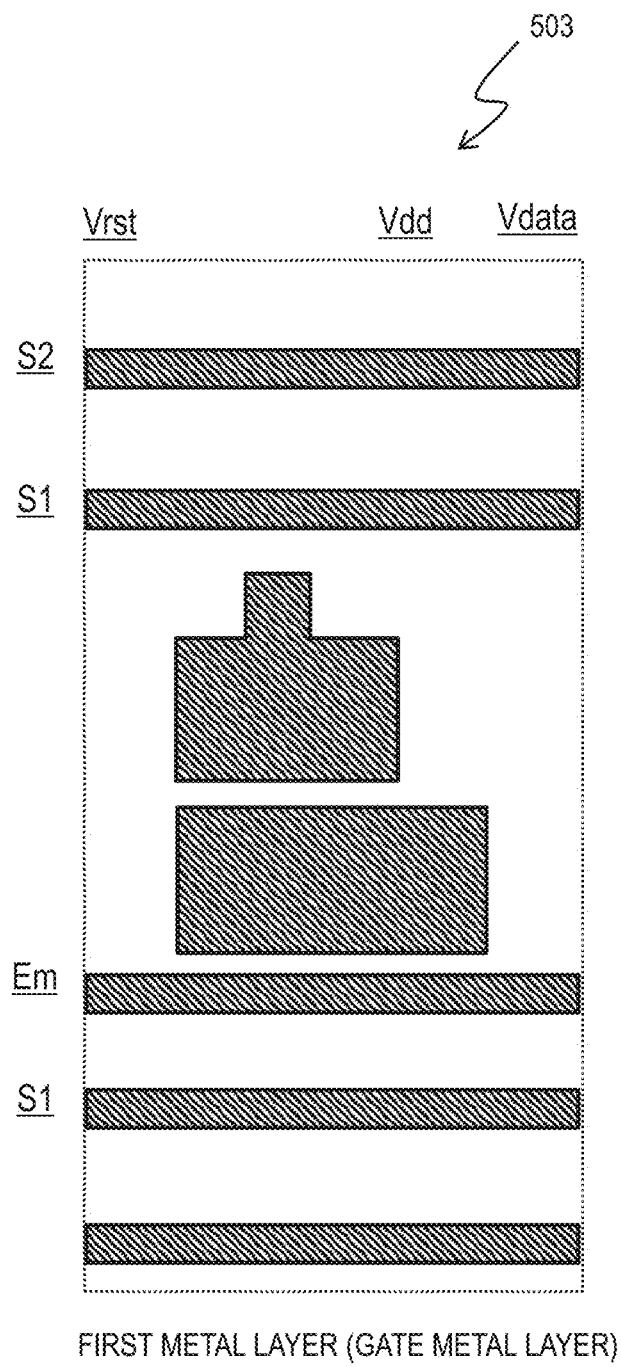
FIG. 5B illustrates a pattern of another layer included in the layered structure of the TFT substrate.
Figure 5C:
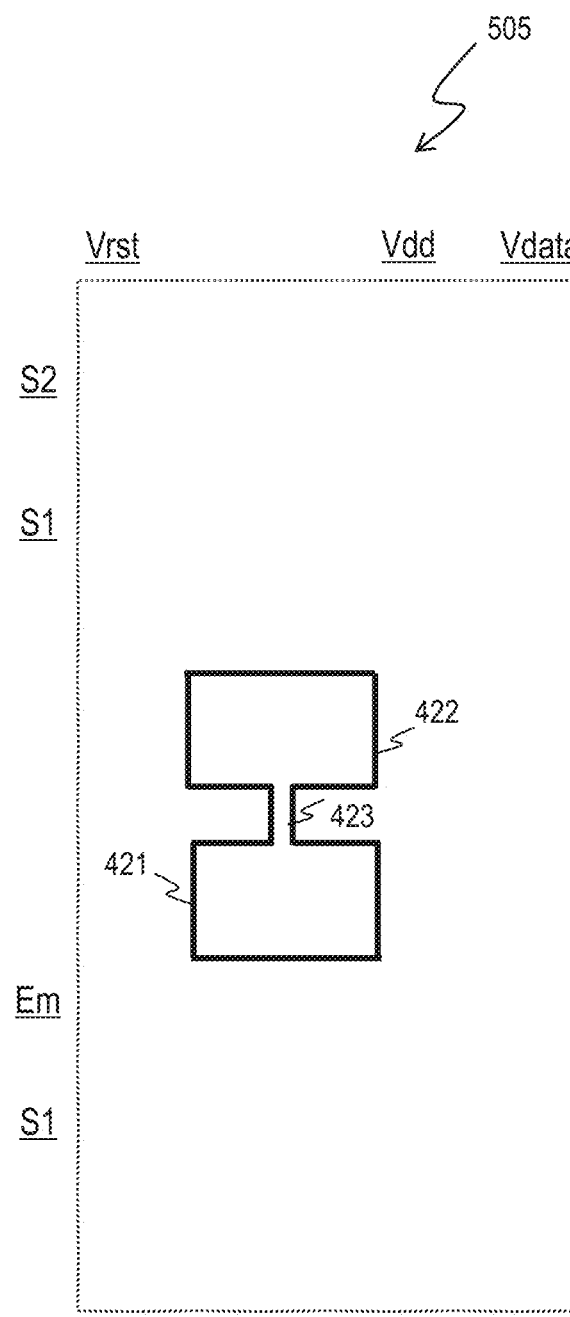
FIG. 5C illustrates a pattern of still another layer included in the layered structure of the TFT substrate.

FIG. 5B schematically illustrates a first metal layer pattern 503. As described above, the first metal layer includes gate electrode regions for the transistors and further, line regions and electrode regions for transmitting a power supply potential or a signal potential. FIG. 5C schematically illustrates an intermediate conductive layer pattern 505. The intermediate conductive layer includes electrode regions 421 and 422 and a connector region 423 for connecting these electrode regions. The electrode regions 421 and 422 are a fifth electrode region and a fourth electrode region, respectively.

The width (the length in the horizontal direction in FIG. 5C) of the connector region 423 is smaller than the width of the electrode regions 421 and 422. It is preferable that the width of the connector region 423 be as smaller as possible to minimize the effect of misalignment or variation in processing onto the two storage capacitors and accordingly, the minimum value allowed for the manufacturing process is employed. For example, it can be ¹/₁₀ or less of the width of the electrode regions 421 and 422. As described above, the intermediate conductive layer is a component of the storage capacitors.

Figure 5D:
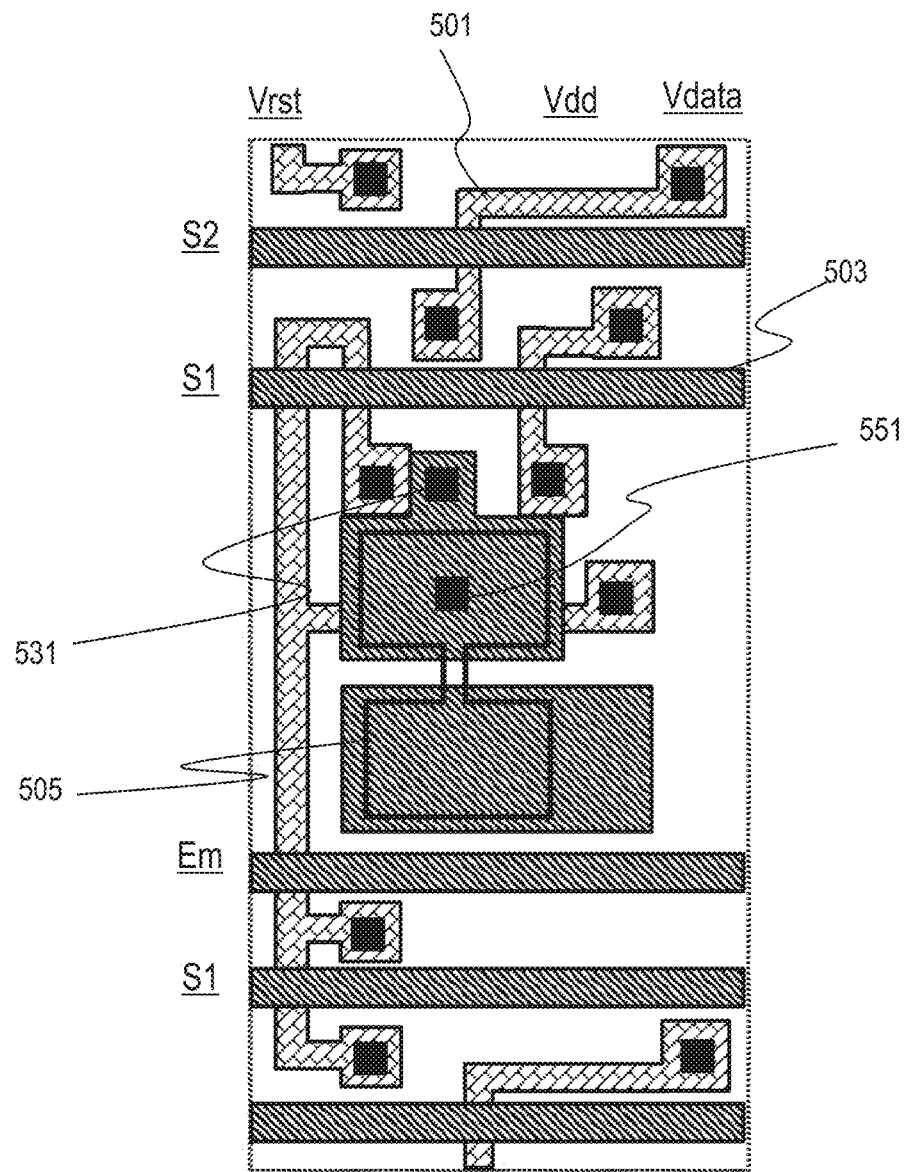
FIG. 5D illustrates patterns of some layers included in the layered structure of the TFT substrate.

FIG. 5D schematically illustrates the layered structure of the semiconductor layer pattern 501, the first metal layer pattern 503, and the intermediate conductive layer pattern 505. FIG. 5D further includes via regions for interconnecting the second metal layer and a conductive layer lower than the second metal layer. The via regions are denoted by filled squares. The via region 531 interconnects the first metal layer and the second metal layer and the via region 551 interconnects the intermediate conductive layer and the second metal layer.

Figure 5E:
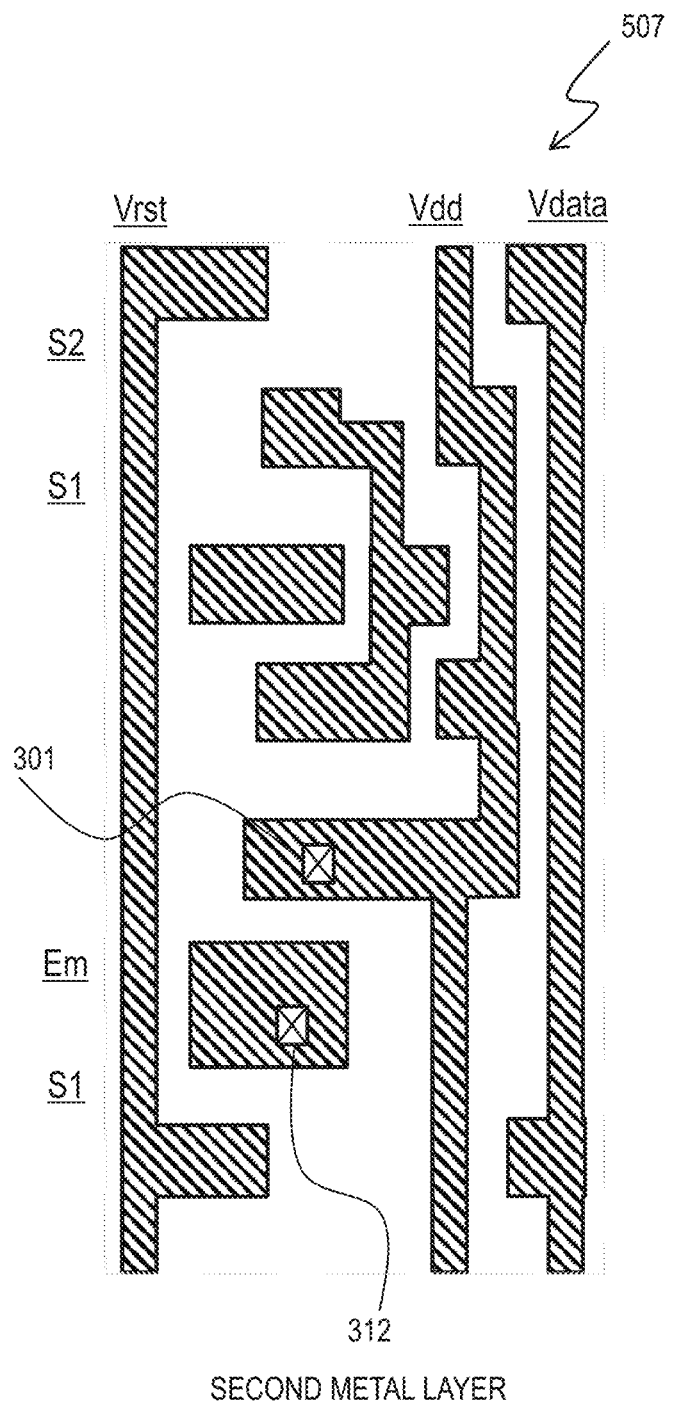
FIG. 5E illustrates a pattern of still another layer included in the layered structure of the TFT substrate.
Figure 5F:
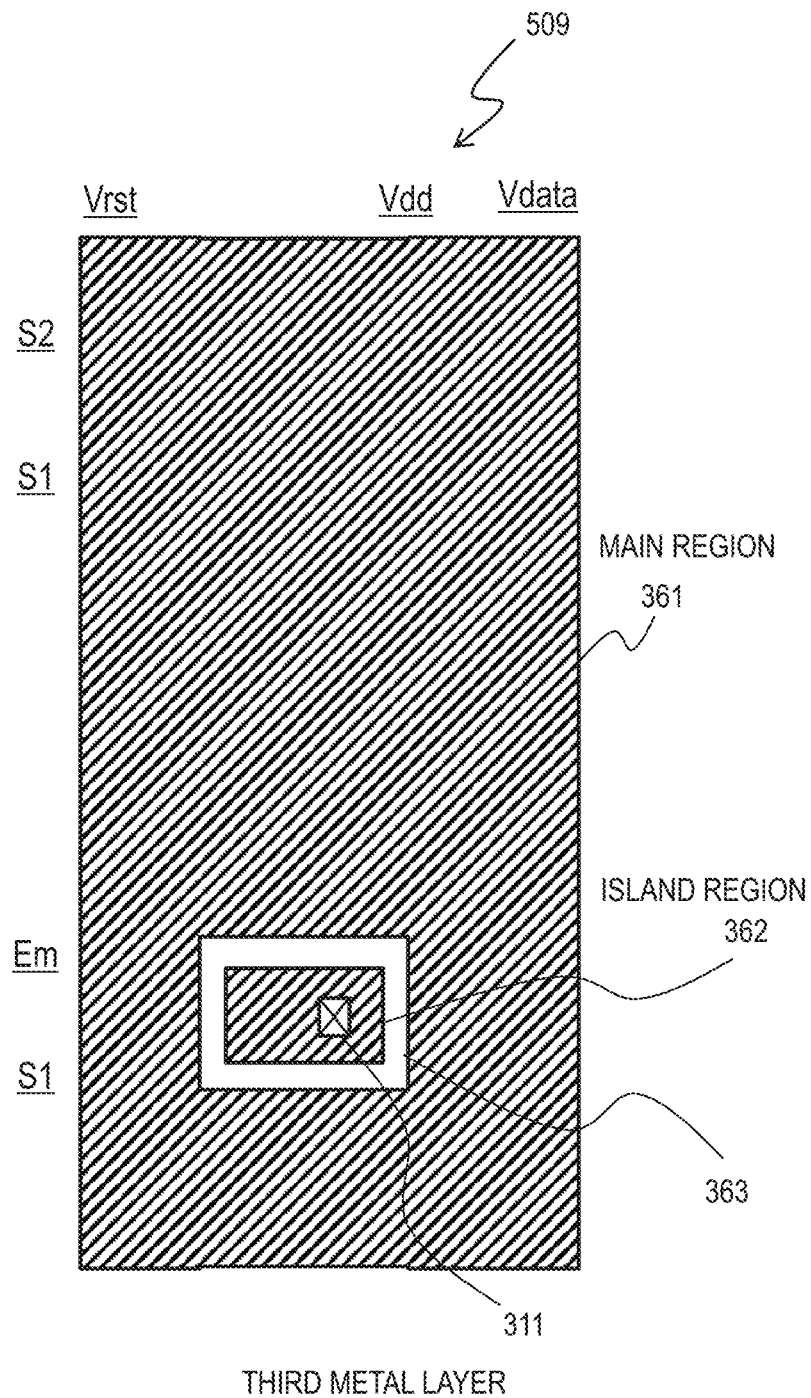
FIG. 5F illustrates a pattern of still another layer included in the layered structure of the TFT substrate.

FIG. 5E schematically illustrates a second metal layer pattern 507. FIG. 5E further includes via regions 301 and 312 for interconnecting the second metal layer and the third metal layer. As described above, the via region 301 interconnects the main region 361 of the third metal layer and the second metal layer. The via region 312 interconnects the island region 362 of the third metal layer and the second metal layer. FIG. 5F schematically illustrates a third metal layer pattern 509. FIG. 5F further includes a via region 311 for interconnecting the third metal layer and the anode electrode of the OLED element E1. As illustrated in FIG. 5F, the main region 361 fills all area of the pixel unit except for the island region 362 and the gap between the main region 361 and the island region 362.

The main region 361 of one pixel unit 300 is a part of one unseparated metal sheet. This metal sheet includes the main regions 361 of a plurality of pixel units 300. As to the island region 362, one pixel unit 300 has one island region 362. The island region 362 is located inside an opening 363 of the main region 361 and the outer end of the island region 362 is distant from the inner end of the opening 363 of the main region 361 at any point.

Figure 5G:
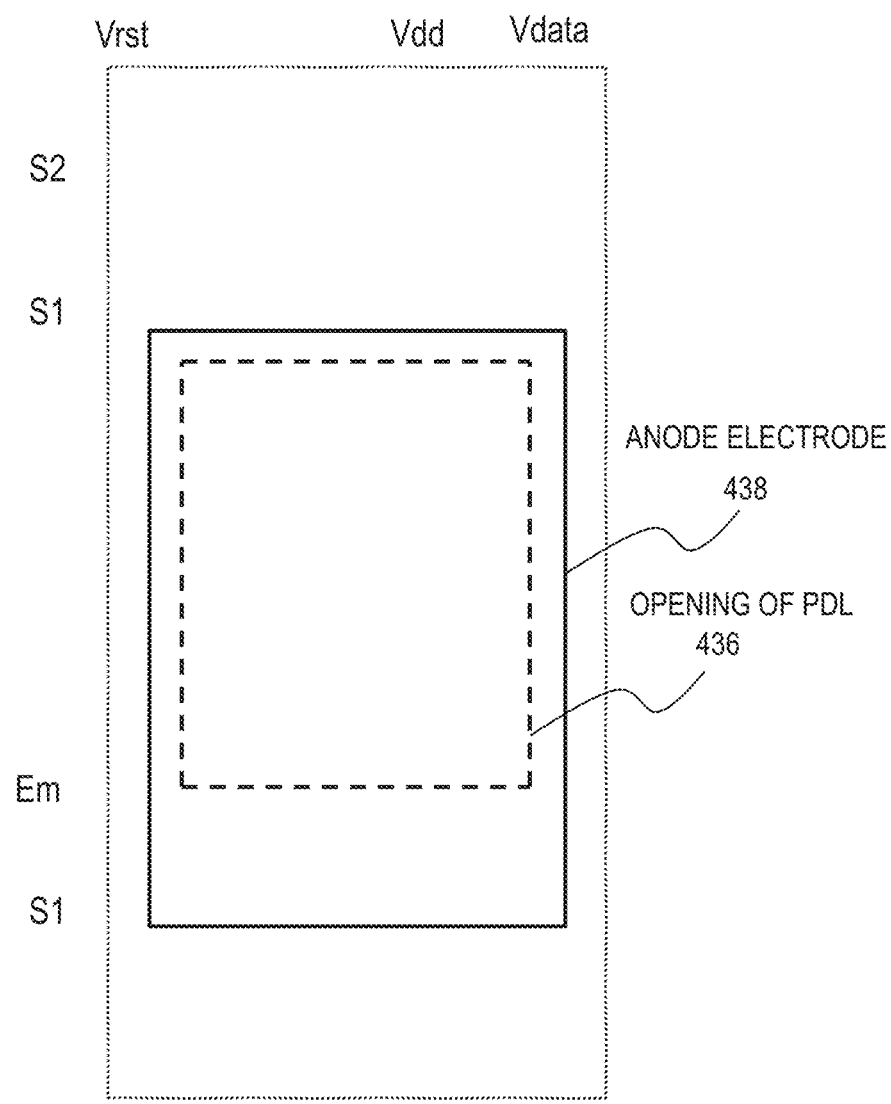
FIG. 5G illustrates a pattern of still another layer included in the layered structure of the TFT substrate.

FIG. 5G schematically illustrates the anode electrode 438 and an opening 436 of the pixel defining layer 437. The light-emitting region is located inside the opening 436. As described above, the driving potential is supplied to the anode electrode 438 through the island region 362 of the third metal layer.

Configuration of Display Region

Figure 6:
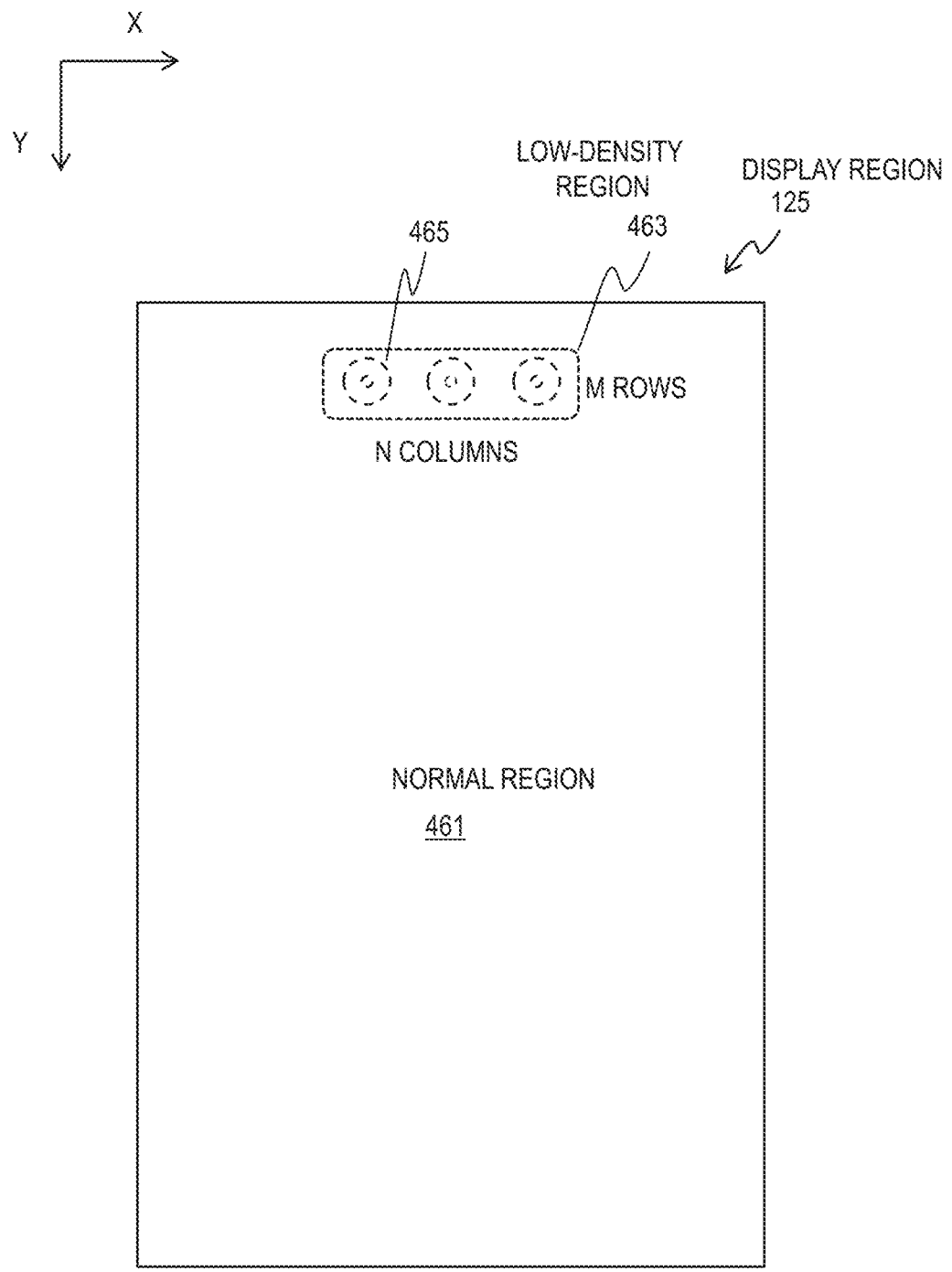
FIG. 6 schematically illustrates a configuration example of a display region.

Hereinafter, a configuration example of the display region 125 in an embodiment of this specification is described. FIG. 6 schematically illustrates a configuration example of a display region 125. The OLED display device 10 can be mounted on a mobile terminal, such as a smartphone or a tablet terminal. The display region 125 includes a normal region 461 having a normal pixel density and a low-density region 463 of N columns and M rows having a pixel density lower than the pixel density of the normal region 461. The normal region 461 is a first display region and the low-density region 463 is a second display region.

One or more cameras 465 are disposed under (behind) the low-density region 463. A camera 465 is an example of photosensor; other kinds of photosensors can be disposed under the low-density region 463. In FIG. 6, one of a plurality of cameras is provided with a reference sign 465 by way of example.

When viewing the display region 125, the cameras 465 are located behind the low-density region 463; each camera 465 takes a picture of an object in front of the camera with light transmitted through the low-density region 463. Not to interfere with the cameras 465 taking a picture, the density of pixel units (including a light-emitting element and a pixel circuit) in the low-density region 463 is lower than the density of pixel units in the surrounding normal region 461.

A not-shown controller sends the data of the pictures taken by the cameras 465 to the OLED display device 10. Although the example of a low-density region in FIG. 6 is a region where cameras are disposed thereunder, the features of this description are applicable to display devices including a region having a relatively low pixel density for other purposes. The frequency of the light to be sensed by the photosensor is not limited to a specific value.

Layout of Lines and Third Metal Layer

Figure 7:
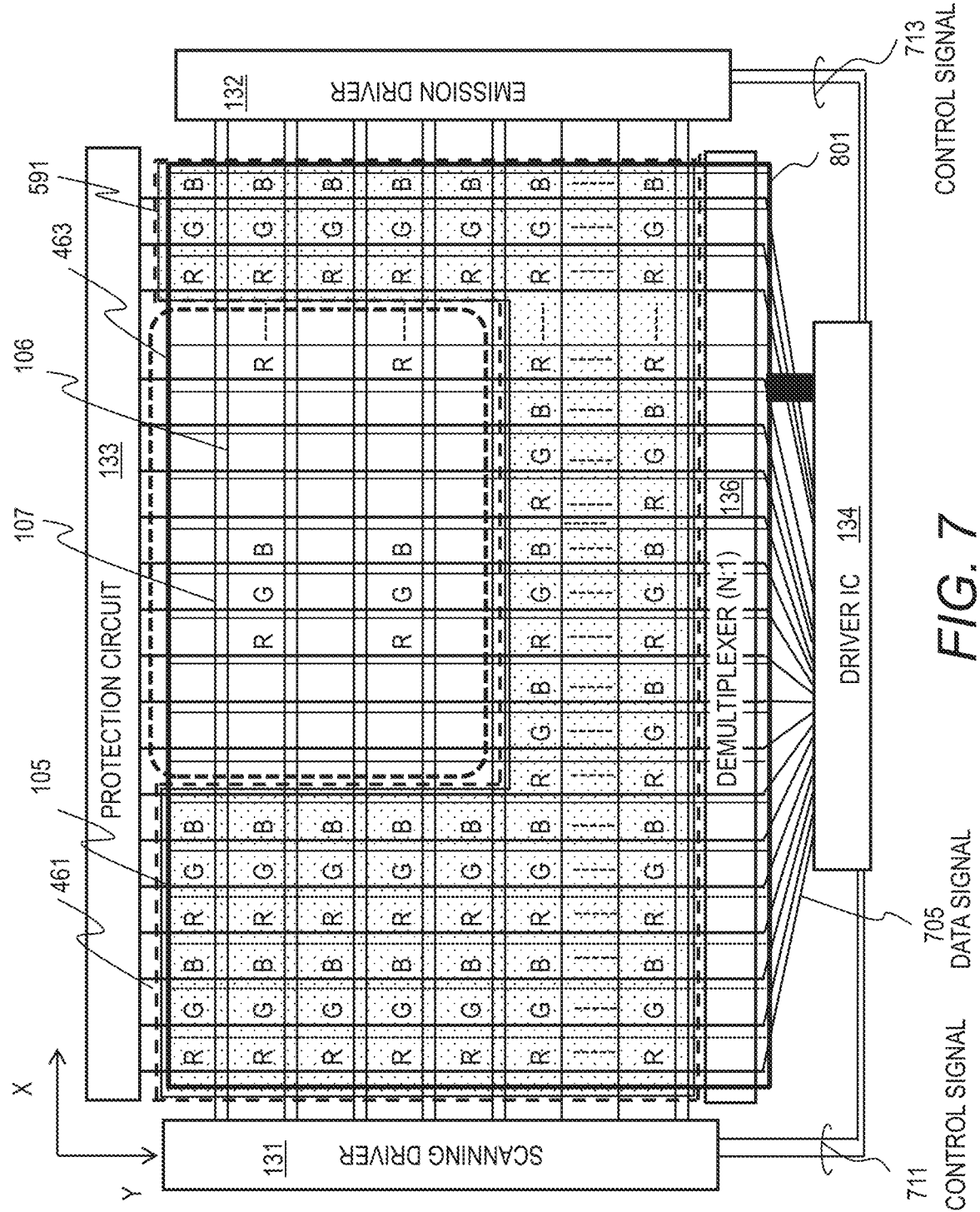
FIG. 7 schematically illustrates a layout of control lines on the TFT substrate.

Hereinafter, an example of the wiring layout of the OLED display device 10 is described. FIG. 7 schematically illustrates a layout of control lines on the TFT substrate 100. The low-density region 463 in the configuration example in FIG. 7 includes an end of the display region 125; one side of the low-density region 463 is a part of one side of the display region 125. The remaining outer end of the low-density region 463 is located inside the display region 125 and it is the boundary with the normal region 461.

The layout of pixel circuits in the normal region 461 in the configuration example of FIG. 7 is stripe arrangement. Specifically, each pixel column (subpixel column) extending along the Y-axis is composed of pixels (subpixels) of the same color. Each pixel row extending along the X-axis is composed of red pixels, green pixels, and blue pixels disposed cyclically. The low-density region 463 has a configuration such that some pixels are removed from the pixel layout of the normal region 461. The blank area in the low-density region 463 does not include any pixel circuit including an OLED element but includes only lines.

A plurality of scanning lines 106 extend along the X-axis from the scanning driver 131. A plurality of emission control lines 107 extend along the X-axis from the emission driver 132. In FIG. 7, one of the scanning lines and one of the emission control lines are provided with reference signs 106 and 107, respectively. A scanning line 106 in the configuration example of FIG. 7 transmits a selection signal for pixels in the normal region 461 and the low-density region 463. An emission control line 107 transmits an emission control signal for the normal region 461 and the low-density region 463.

The driver IC 134 sends a control signal for the scanning driver 131 through lines 711 and a control signal for the emission driver 132 through lines 713. The driver IC 134 controls the timing of the scanning signal (selection pulses) from the scanning driver 131 and the emission control signal from the emission driver 132, based on image data (an image signal) from the external.

The driver IC 134 supplies data signals for the subpixels in the normal region 461 and the low-density region 463 to the demultiplexer 136 through lines 705. In FIG. 7, one of the lines is provided with a reference sign 705 by way of example. The driver IC 134 determines data signals for individual subpixels in the normal region 461 and the low-density region 463. The data signal for one subpixel is determined from grayscale levels of one or more subpixels of image data (for one frame) from the external.

The demultiplexer 136 outputs one output of the driver IC 134 to N data lines (N is an integer greater than 1) in series within a scanning period. In FIG. 7, one of the plurality of data lines extending along the Y-axis is provided with a reference sign 105, by way of example.

FIG. 7 also schematically illustrates a layout of an anode power line pattern on the TFT substrate 100. As illustrated in FIG. 7, the TFT substrate 100 includes an anode power line pattern 801. The anode power line pattern 801 supplies an anode power supply potential to the pixel circuits in the normal region 461 and the low-density region 463.

The anode power line pattern 801 includes a rectangular surrounding part and a line part inside the surrounding part. In the line part, lines extending along the Y-axis are disposed side by side along the X-axis. Some lines extend through the normal region 461 and the low-density region 463. The anode power line pattern 801 transmits the anode power supply potential VDD to the pixel circuits of individual subpixels in the normal region 461 and the low-density region 463. The anode power line pattern 801 can be different from the example of FIG. 7. For example, the anode power line pattern 801 can be spread like a mesh including a plurality of lines extending along the X-axis, in addition to the lines extending along the Y-axis.

FIG. 7 further schematically illustrates the third metal layer 591. The main regions of the third metal layer 591 are supplied with the anode power supply potential VDD from the anode power line pattern 801. In this example, the third metal layer 591 is provided in the normal region 461 and not provided in the low-density region 463. Since the third metal layer 591 is removed from (is not provided in) the low-density region 463 and is provided only outside the low-density region 463, the reduction of the light that passes through the low-density region 463 to reach the cameras 465 behind the low-density region 463 can be made small.

Unlike the configuration where the low-density region 463 is located inside an opening of the third metal layer, the third metal layer 591 can be partially located in the low-density region 463. The third metal layer 591 in the low-density region 463 has a different pattern from the pattern of the third metal layer 591 in the normal region 461.

The occupancy of the third metal layer 591 in the low-density region 463 is lower than the one in the normal region 461. This configuration reduces the reduction of light to reach the cameras 465. The occupancy in a region is a value obtained by dividing the area of the region filled with the third metal layer 591 by the area of the whole region.

In an example, the pixel circuits in the normal region 461, the pixel circuits in the low-density region 463, and the pixel units have the same external dimensions. The pixel units in the normal region 461 have a structure described with reference to FIGS. 3 to 5G.

The low-density region 463, however, does not include the third metal layer 591 and accordingly, the pixel units in the low-density region 463 have a structure such that the third metal layer is removed from the structure described with reference to FIGS. 3 to 5G. For this reason, the via region 311 shown in FIG. 4 is in direct contact with the electrode region 428 of the second metal layer. In other words, the anode electrode 438 is connected with the second metal layer by a via region extending straight downward, not via the third metal layer. The pixel units in the low-density region 463 may include the third metal layer. For example, the third metal layer can have only the island pattern at the location of the via region 311. This configuration equalizes contact resistances from a driving TFT to an anode electrode between the low-density region and the high-density region (normal region). The occupancy of the third metal layer in a pixel unit (pixel region) in the low-density region 463 is lower than the one in the normal region 461.

The driver IC 134 includes a DC-DC converter to generate a plurality of power supply potentials and supplies the power supply potentials to the OLED display panel. The driver IC 134 outputs the anode power supply potential VDD to the anode power line pattern 801 and outputs the cathode power supply potential VSS to the cathode electrode 432.

The cathode electrode layer not shown in FIG. 7 has a shape of one sheet and fully covers the normal region 461 and the low-density region 463. The cathode electrode of each pixel in these regions 461 and 463 is a part of this one sheet of cathode electrode layer.

OTHER CONFIGURATION EXAMPLES

Hereinafter, another structure of a pixel unit in the normal display region 461 is described. In the structural example described with reference to FIGS. 3 to 5G, the main region of the third metal layer covers the whole intermediate conductive layer in a pixel unit when viewed in the layering direction. In another configuration example of a pixel unit, the main region covers only a part of the intermediate conductive layer. The capacitance of the first capacitive element C1 can be adjusted by adjusting the area of the main region covering the intermediate conductive layer.

Figure 8A:
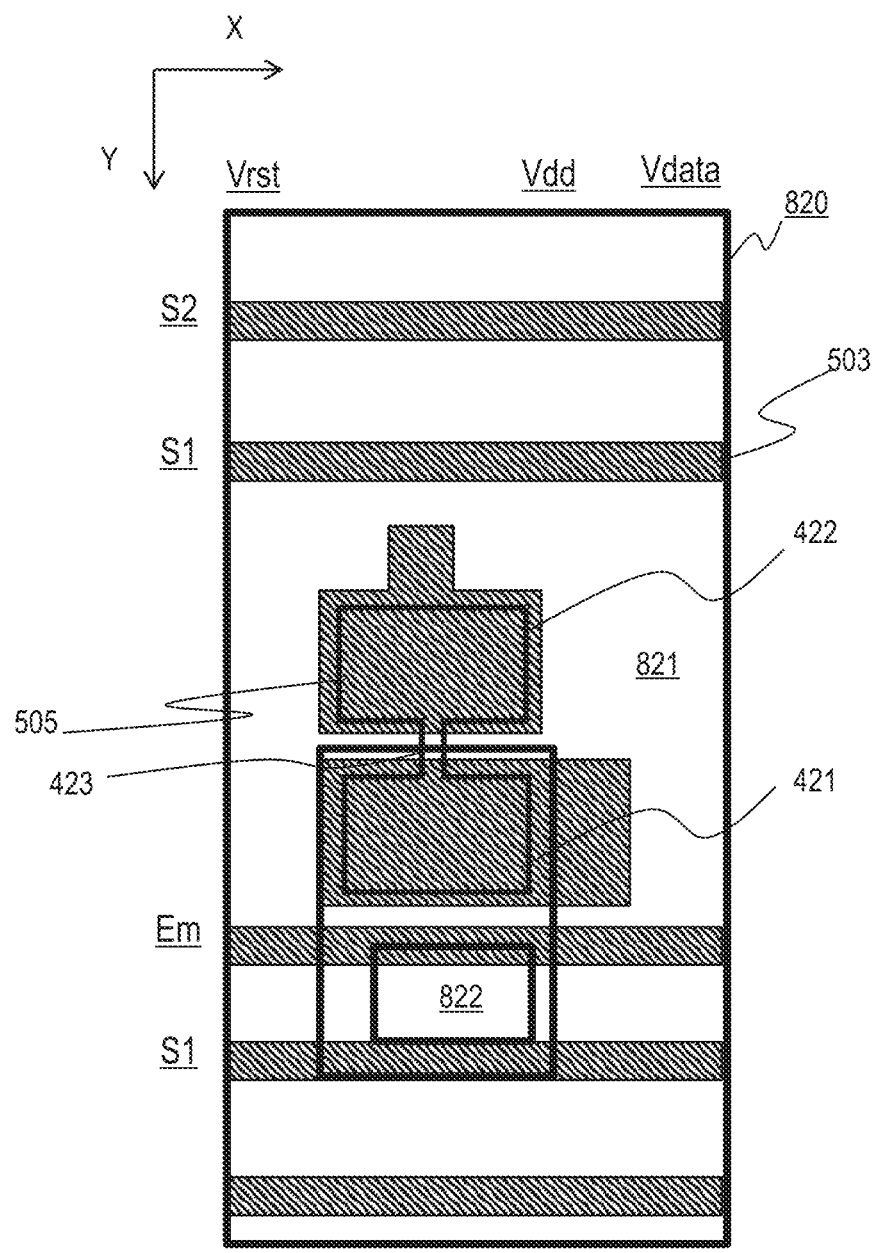
FIG. 8A illustrates a first metal layer pattern, an intermediate conductive layer pattern, and a third metal layer pattern in another structural example of a pixel unit including a third metal layer.

FIG. 8A illustrates a first metal layer pattern 503, an intermediate conductive layer pattern 505, and a third metal layer pattern 820 in another structural example of a pixel unit including a third metal layer. Compared to the structure described with reference to FIGS. 3 to 5G, the first metal layer pattern 503 and the intermediate conductive layer pattern 505 are the same and the third metal layer pattern 820 is different.

Figure 8B:
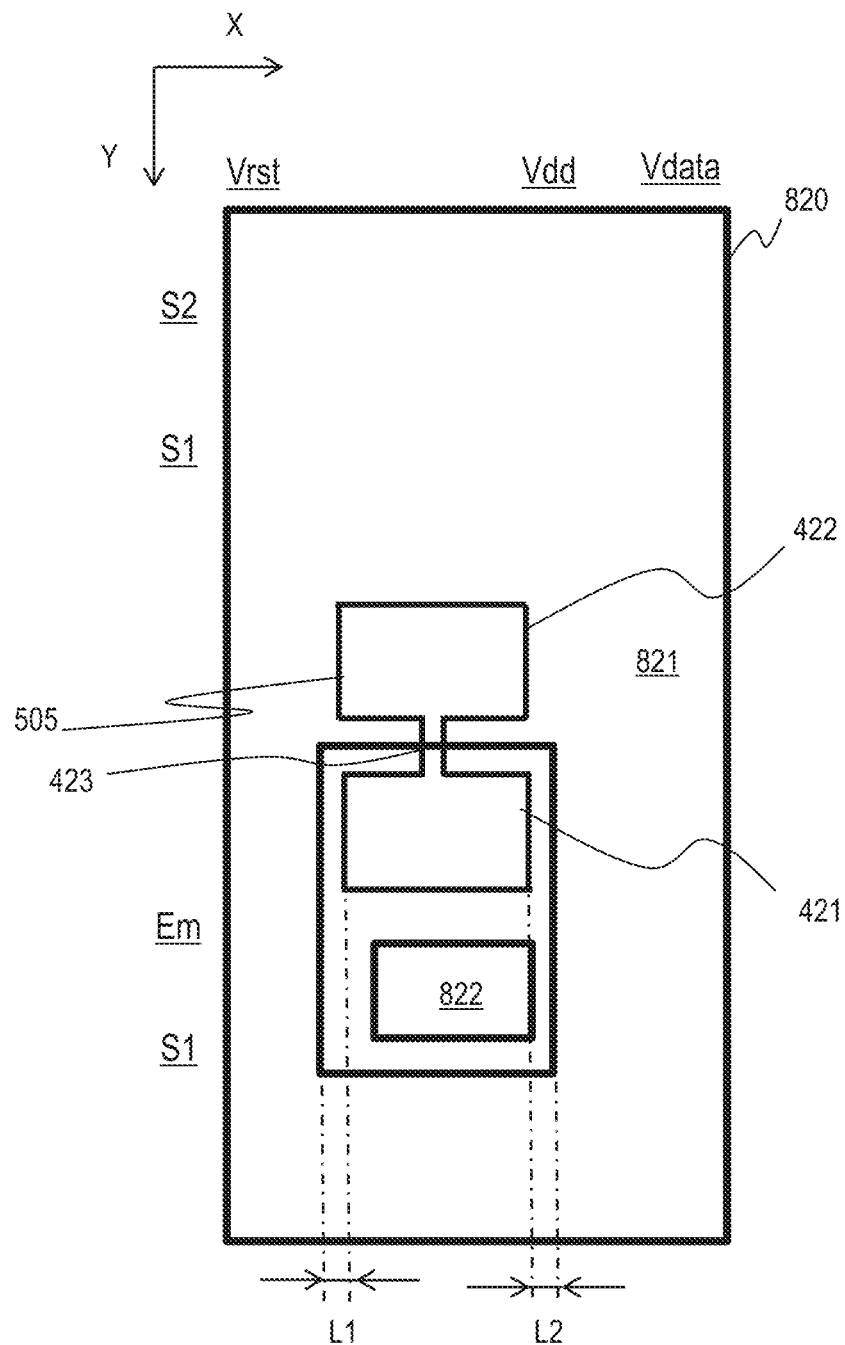
FIG. 8B illustrates the intermediate conductive layer pattern and the third metal layer pattern in the structural example illustrated in FIG. 8A.

FIG. 8B illustrates the intermediate conductive layer pattern 505 and the third metal layer pattern 820 in the structural example illustrated in FIG. 8A. The third metal layer pattern 820 in a pixel unit consists of a main region 821 and an island region 822. The island region 822 is located inside an opening of the main region 821.

There is a gap around the island region 822 to isolate the island region 822 from the main region 821. This gap has a larger area than that of the foregoing structural example. Accordingly, the occupancy of the third metal layer in the pixel unit is lower than that of the foregoing structural example. The electrode region 421 of the intermediate conductive layer is located within the gap between the main region 821 and the island region 822; it does not overlap the third metal layer pattern 820 in the layering direction. However, the whole electrode region 422 of the intermediate conductive layer overlaps (is covered with) the third metal layer pattern 820 in the layering direction.

The intermediate conductive layer pattern 505 includes a connector region 423 connecting the two electrode regions 421 and 422 in the Y-axis direction (first direction). It is preferable that the width (the length in the X-axis direction (second direction) in FIG. 8B) of the connector region 423 be smaller than the width of the electrode regions 421 and 422; the minimum value allowed for the manufacturing process is employed. As a result, the variation in capacitance of the storage capacitor caused by an alignment error in the Y-axis direction of the intermediate conductive layer can be minimized.

As illustrated in FIG. 8B, distances L1 and L2 are defined between an end of the electrode region 421 of the intermediate conductive layer and an end (inner end of the opening) of the main region 821 of the third metal layer. In an example, these distances L1 and L2 are equal. This configuration reduces the effect of alignment error.

Figure 8C:
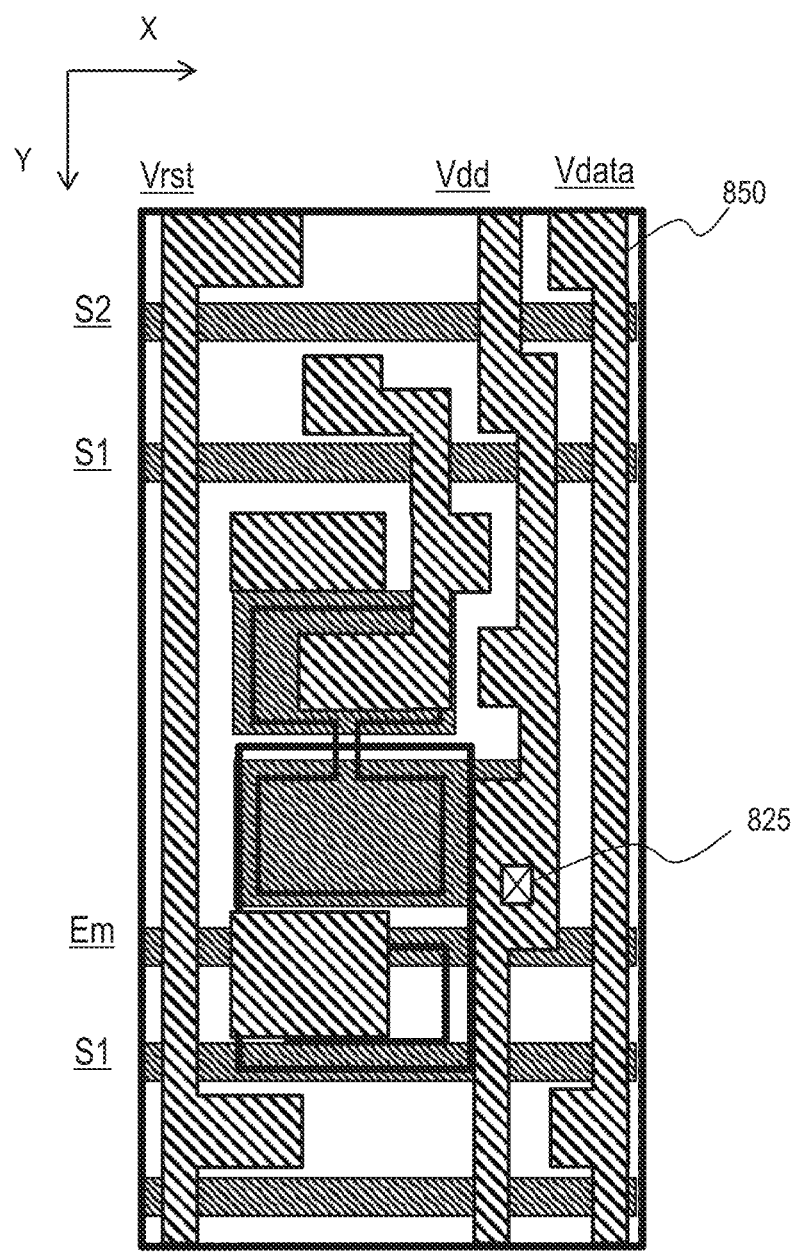
FIG. 8C illustrates a second metal layer pattern in addition to the layered structure illustrated in FIG. 8A.

FIG. 8C illustrates a second metal layer pattern 850, in addition to the layered structure illustrated in FIG. 8A. Since this embodiment is configured so that the third metal layer does not overlap the electrode region 421 of the intermediate conductive layer, a via region 825 for connecting the second metal layer pattern 850 and the third metal layer pattern 820 is provided at a different location, compared to the foregoing structural example. The via region 825 interconnects the main region 821 of the third metal layer and an electrode region (line region) of the second metal layer for transmitting the anode power supply potential VDD, like the via region 301 in the foregoing structural example.

Figure 9:
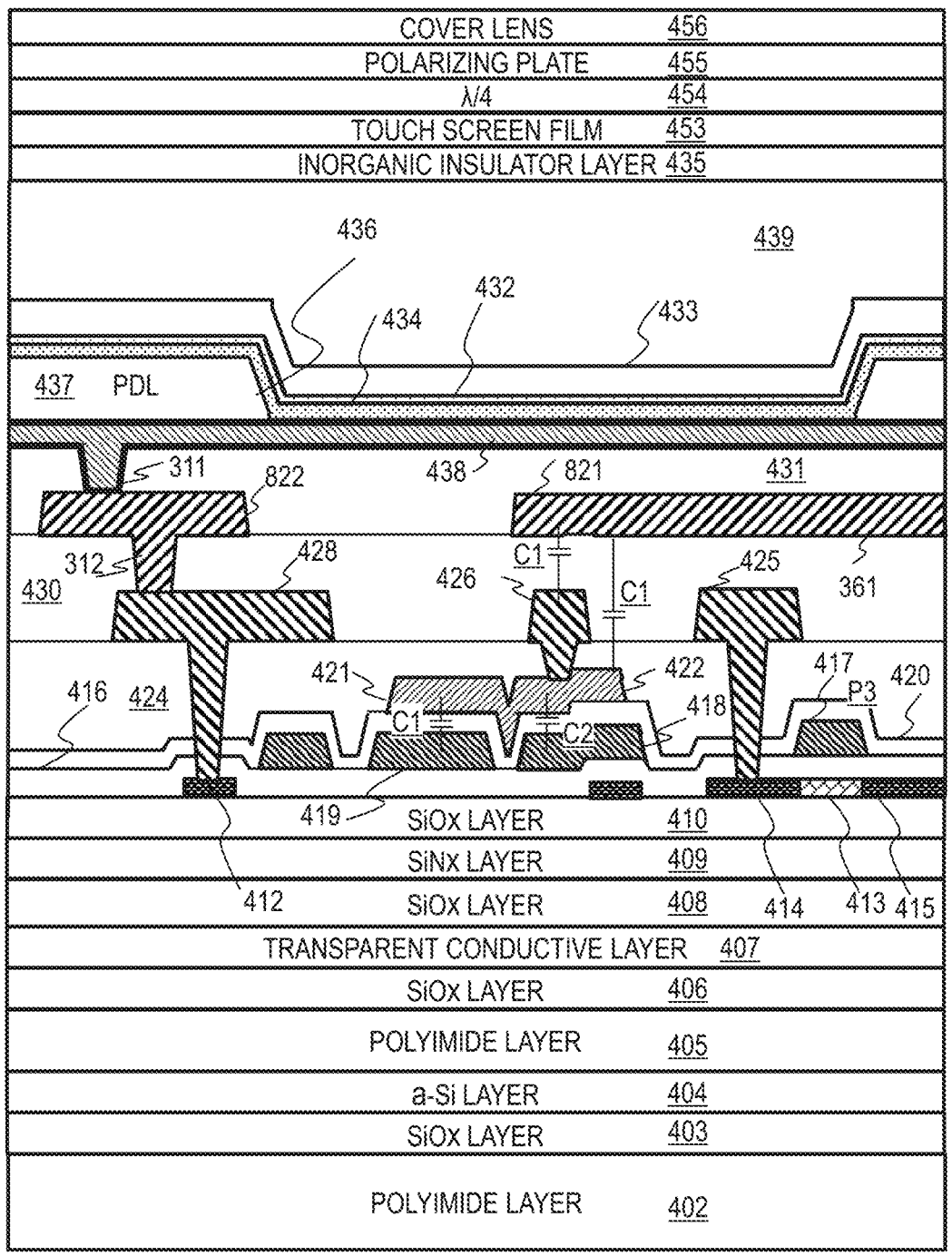
FIG. 9 is a cross-sectional diagram schematically illustrating the cross-sectional structure of the other structural example of a pixel unit.

FIG. 9 is a cross-sectional diagram schematically illustrating the cross-sectional structure of this structural example of a pixel unit. The following mainly describes differences from the structural example in FIG. 4. The electrode region 421 of the intermediate conductive layer is not covered with the third metal layer pattern and is located inside an opening. Since the via region connecting the second metal layer and the third metal layer is provided at a different location, this example does not include the via region 301 and the electrode region 427 of the second metal layer in FIG. 4.

Like in the structural example in FIG. 4, a part of the first capacitive element C1 is formed between the main region 821 of the third metal layer and the electrode region 426 of the second metal layer and another part of the first capacitive element C1 is formed between the main region 821 and the electrode region 422 of the intermediate conductive layer. The second capacitive element C2 is formed only between the intermediate conductive layer and the first metal layer.

Another example of application of the third metal layer is described. The example described in the following uses the third metal layer as a pinhole matrix layer. The pinhole matrix layer includes a pinhole array including a plurality of pinholes disposed in two dimensions. A pinhole transmits only the light coming in a specific direction from a point of an object.

Figure 10:
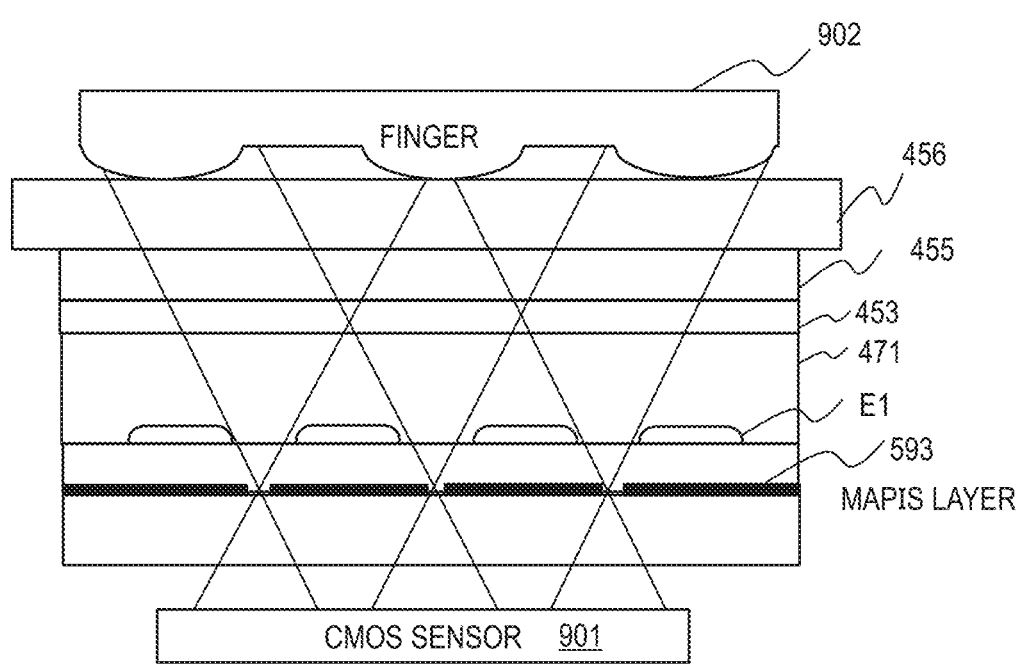
FIG. 10 is a cross-sectional diagram schematically illustrating the cross-sectional structure of a low-density region including a third metal layer having another example of pattern.

FIG. 10 is a cross-sectional diagram schematically illustrating the cross-sectional structure of a low-density region 463. In the low-density region 463, the third metal layer functions as a matrix pinhole image sensing (MAPIS) layer 593. The MAPIS layer 593 is a pinhole matrix layer.

A structural encapsulation unit 471 is laid to cover OLED elements E1. A touch screen film 453, a polarizing plate 455, and a cover lens 456 are laid in this order from the bottom above the structural encapsulation unit 471. The third metal layer pattern in the normal region 461 is the same as the one described with reference to FIGS. 3 to 5G or FIGS. 8A to 9. As understood from this description, the pattern of the third metal layer in the low-density region 463 is different from the pattern of the third metal layer in the normal region 461.

In FIG. 10, a CMOS sensor 901 of a photosensor is disposed under (behind) the MAPIS layer 593. The configuration example illustrated in FIG. 10 can function as a fingerprint sensor, for example. A finger 902 to be imaged reflects light from the OLED elements E1. The light from the finger 902 passes through the pinhole array of the MAPIS layer 593 to form an image on the CMOS sensor 901. The image of the fingerprint taken by the CMOS sensor 901 is transferred to a not-shown controller. The controller compares the acquired fingerprint image with the fingerprint data of a registered user to authenticate the user.

The MAPIS layer 593 is supplied with the anode power supply potential VDD. The MAPIS layer 593 partially forms one or more capacitors included in a storage capacitive element. All area of the MAPIS layer 593 except for the pinholes is filled with metal. In an example, the occupancy of the MAPIS layer 593 in a pixel unit is higher than the occupancy of the third metal layer in a pixel unit in the normal region 461. As illustrated in this configuration example and other configuration examples, the third metal layer having different patterns in different regions of the display regions 125 can provide the photosensor behind the third metal layer with light appropriate for the purpose of the region.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a first display region configured to display an image;
   a second display region configured to display an image, the second display region having a lower pixel density than the first display region;
   a first metal layer;
   a second metal layer located upper than the first metal layer; and
   a third metal layer located upper than the first metal layer and the second metal layer,
   wherein occupancy of the third metal layer in the second display region is lower than occupancy of the third metal layer in the first display region,
   wherein the first display region includes a plurality of first pixel units and each of the plurality of first pixel units includes:
      a light-emitting element including an upper electrode region, a lower electrode region, and a light-emitting layer located between the upper electrode region and the lower electrode region; and
      a driving transistor configured to control light emission of the light-emitting element,
   wherein the first metal layer, the second metal layer, and the third metal layer are located lower than the lower electrode region,
   wherein, in each of the plurality of first pixel units, the first metal layer includes a first electrode region configured to control an amount of electric current in a channel of the driving transistor,
   wherein, in each of the plurality of first pixel units, the second metal layer includes a second electrode region and a third electrode region configured to supply electric current to the channel of the driving transistor, and
   wherein, in each of the plurality of first pixel units, the third metal layer includes:
      a main region configured to be supplied with a power supply potential and form a capacitor included in a first capacitive element with the second metal layer, the first capacitive element being configured to store a voltage to control the driving transistor; and
      an island region separated from the main region and surrounded by the main region with a gap, the island region being interconnected with the lower electrode region by a via region.

2. The display device according to claim 1, further comprising an intermediate conductive layer between the first metal layer and the second metal layer,
   wherein, in each of the plurality of first pixel units, the intermediate conductive layer is configured to form a capacitor included in a second capacitive element different from the first capacitive element with the first metal layer, and
   wherein, in each of the plurality of first pixel units, the intermediate conductive layer is configured to form a capacitor included in the first capacitive element with the main region.

3. The display device according to claim 2, wherein, in each of the plurality of first pixel units, the main region covers all area of the intermediate conductive layer when viewed in a layering direction.

4. The display device according to claim 1, wherein the main region fills all area of the first pixel unit except for the island region and the gap.

5. The display device according to claim 1, wherein the second display region does not include the third metal layer.

6. An electronic device comprising:
the display device according to claim 1; and
a photosensor disposed under the second display region.

7. A display device comprising:
a first display region configured to display an image;
a second display region configured to display an image, the second display region having a lower pixel density than the first display region;
a first metal layer;
a second metal layer located upper than the first metal layer; and
a third metal layer located upper than the first metal layer and the second metal layer,
wherein a pattern of the third metal layer in the second display region is different from a pattern of the third metal layer in the first display region,
wherein the first display region includes a plurality of first pixel units and each of the plurality of first pixel units includes:
  a light-emitting element including an upper electrode region, a lower electrode region, and a light-emitting layer located between the upper electrode region and the lower electrode region; and
  a driving transistor configured to control light emission of the light-emitting element,
wherein the first metal layer, the second metal layer, and the third metal layer are located lower than the lower electrode region,
wherein, in each of the plurality of first pixel units, the first metal layer includes a first electrode region configured to control an amount of electric current in a channel of the driving transistor,
wherein, in each of the plurality of first pixel units, the second metal layer includes a second electrode region and a third electrode region configured to supply electric current to the channel of the driving transistor, and
wherein, in each of the plurality of first pixel units, the third metal layer includes:
  a main region configured to be supplied with a power supply potential and form a capacitor included in a first capacitive element with the second metal layer, the first capacitive element being configured to store a voltage to control the driving transistor; and
  an island region separated from the main region and surrounded by the main region with a gap, the island region being interconnected with the lower electrode region by a via region.

8. The display device according to claim 7, wherein the third metal layer includes a pinhole array in the second display region.

9. An electronic device comprising:
the display device according to claim 7; and
a photosensor disposed under the second display region.

10. The display device according to claim 2,
wherein, in each of the plurality of first pixel units, the intermediate conductive layer includes a fourth electrode region, a fifth electrode region, and a connector region connecting the fourth electrode region and the fifth electrode region in a first direction,
wherein the whole fourth electrode region is covered with the third metal layer when viewed in a layering direction,
wherein the fifth electrode region is located in a gap between the main region and the island region when viewed in the layering direction, and
wherein the connector region has a smaller length than the fourth electrode region and the fifth electrode region in a second direction perpendicular to the first direction.

11. The display device according to claim 2,
wherein, in each of the plurality of first pixel units, the intermediate conductive layer includes a fourth electrode region and a fifth electrode region,
wherein the whole fourth electrode region is covered with the third metal layer when viewed in a layering direction,
wherein the fifth electrode region is located in a gap between the main region and the island region when viewed in the layering direction, and
wherein distances from two sides of the fifth electrode region to the main region are equal.

* * * * *